United States Patent
Suzuki et al.

(10) Patent No.: US 6,566,617 B1
(45) Date of Patent: May 20, 2003

(54) MICROMACHINE SWITCH AND ITS PRODUCTION METHOD

(75) Inventors: Kenichiro Suzuki, Tokyo (JP); Youichi Ara, Tokyo (JP); Shuguang Chen, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/868,575

(22) PCT Filed: Dec. 16, 1999

(86) PCT No.: PCT/JP99/07077

§ 371 (c)(1),
(2), (4) Date: Jun. 20, 2001

(87) PCT Pub. No.: WO00/38208

PCT Pub. Date: Jun. 29, 2000

(30) Foreign Application Priority Data

Dec. 22, 1998 (JP) .............................. 10-365677

(51) Int. Cl.[7] .............................................. H01H 57/00

(52) U.S. Cl. ...................................... 200/181; 200/849

(58) Field of Search ................... 200/181; 29/825–887; 335/78; 257/531, 514, 521

(56) References Cited

U.S. PATENT DOCUMENTS

| | | | | |
|---|---|---|---|---|
| 4,959,515 A | * | 9/1990 | Zavracky et al. | 200/181 |
| 6,094,116 A | * | 7/2000 | Tai et al. | 200/181 |
| 6,310,339 B1 | * | 10/2001 | Hsu et al. | 200/181 |
| 6,384,353 B1 | * | 5/2002 | Huang et al. | 200/181 |
| 6,396,368 B1 | * | 5/2002 | Chow et al. | 200/181 |
| 6,440,767 B1 | * | 8/2002 | Loo et al. | 438/52 |

* cited by examiner

Primary Examiner—Anh Mai
Assistant Examiner—Lisa N. Klaus
(74) Attorney, Agent, or Firm—Young & Thompson

(57) ABSTRACT

A micromachine includes a switch having a supporting member provided on a substrate. The supporting member is adjacent to a gap between a signal line and the substrate and has a predetermined height with respect to the substrate. A flexible beam member projects from the supporting member generally parallel to the substrate and extends so that part of the flexible member faces the gap. A contact electrode on the beam member faces the gap. A lower electrode on the substrate faces part of the beam member. Part of the beam member is conductive to function as an upper electrode. The thermal expansion coefficients of the beam member are almost symmetric in the thickness direction perpendicular to the substrate surface, at least from the portion at which the beam member is connected to the supporting member to the portion facing the lower electrode.

18 Claims, 16 Drawing Sheets

(a) FIRST EMBODIMENT (b) A–A' CROSS-SECTIONAL VIEW

FIG. 1
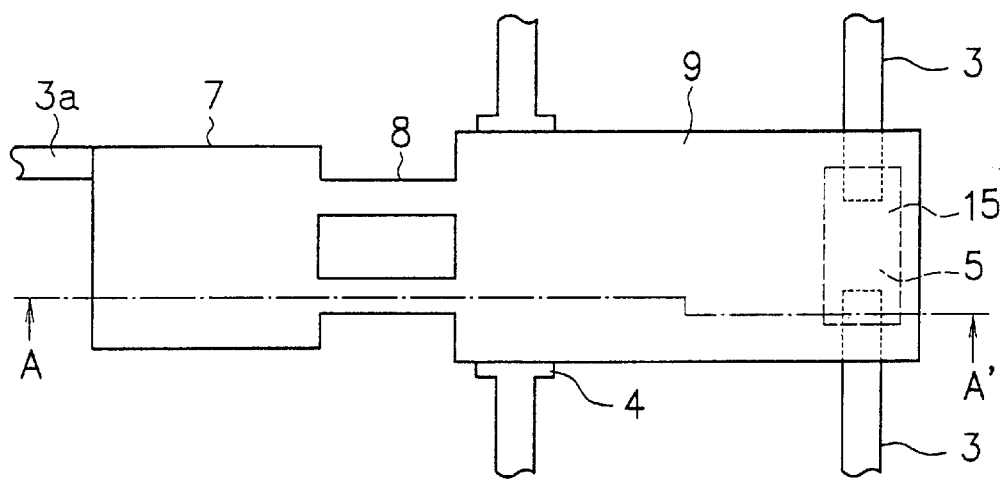
(a) FIRST EMBODIMENT
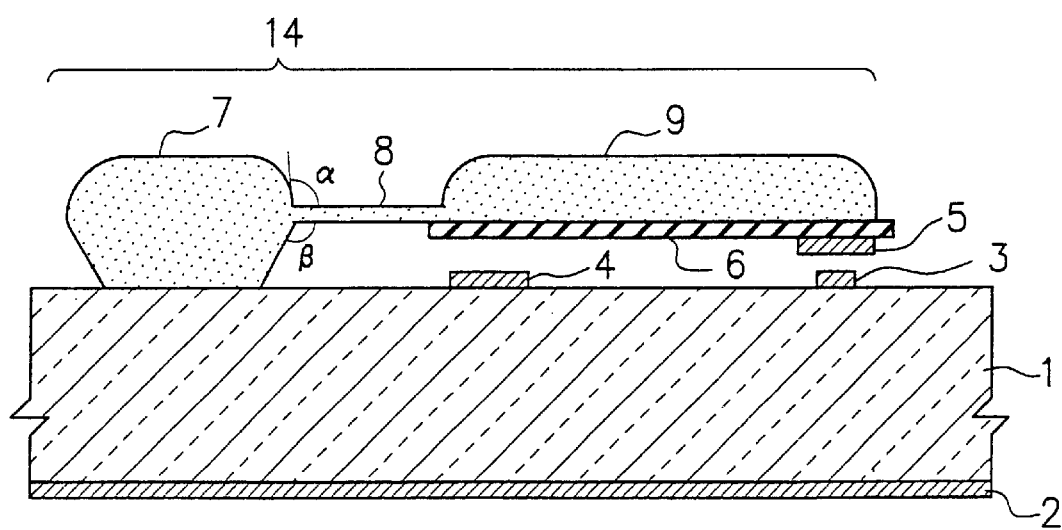
(b) A-A' CROSS-SECTIONAL VIEW

FIG. 3
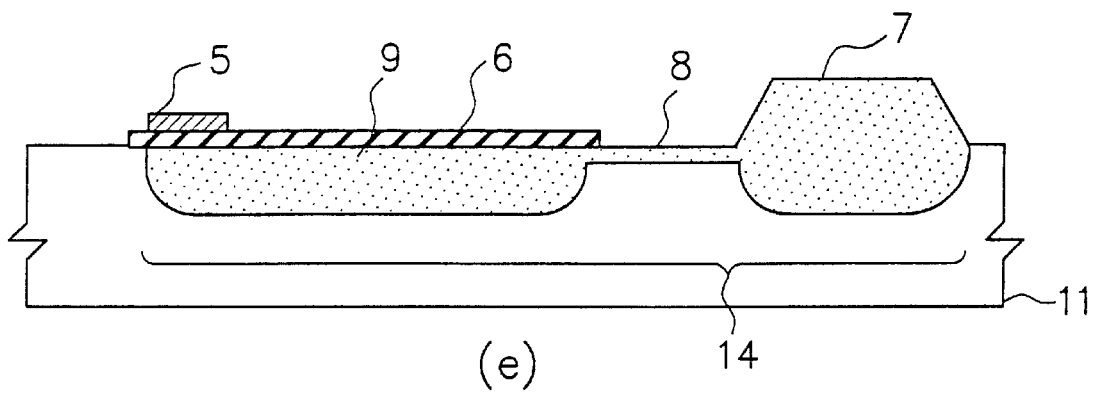
(e)
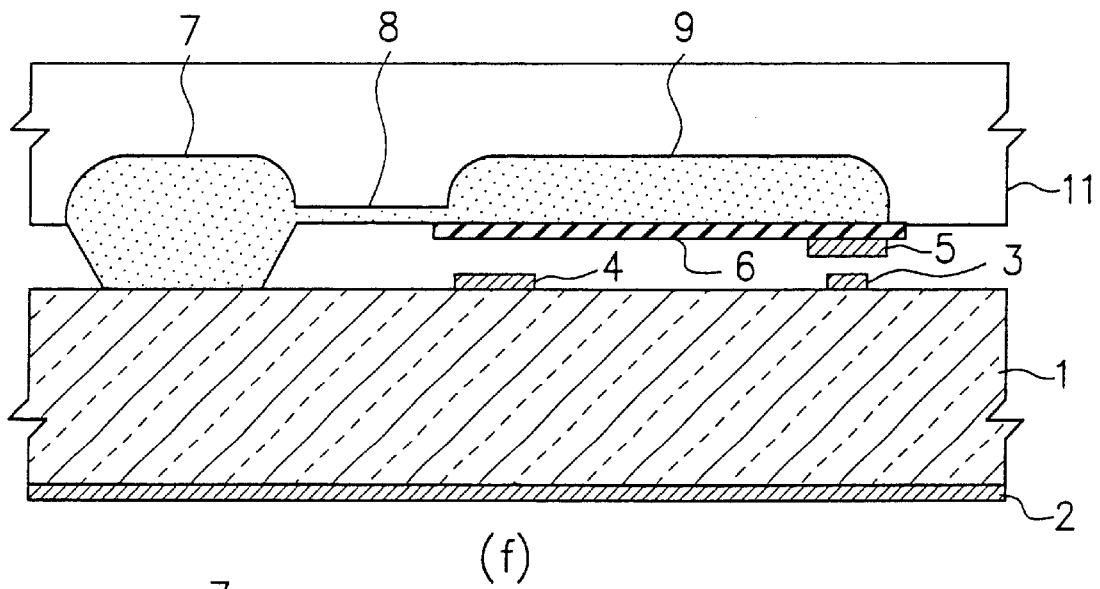
(f)
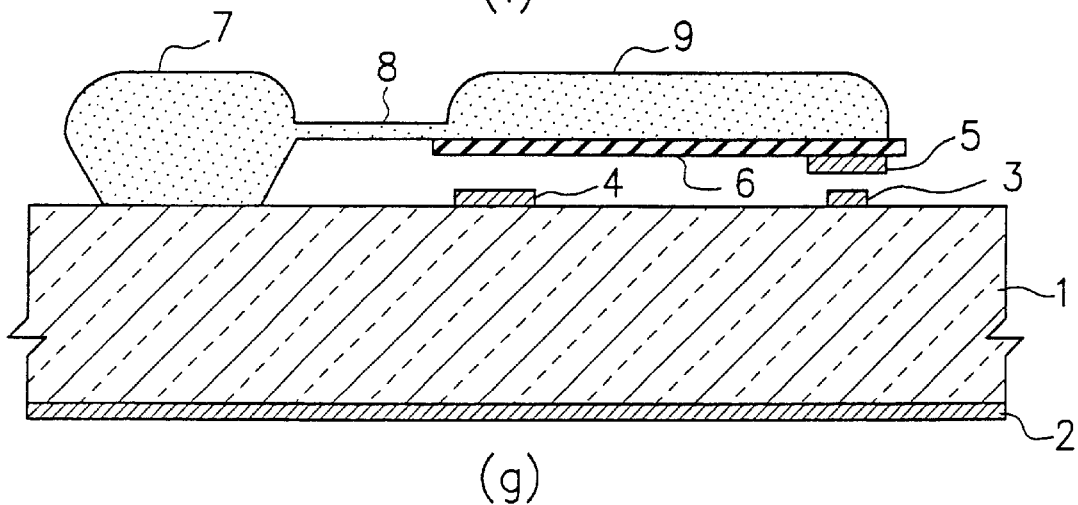
(g)

FIG. 4
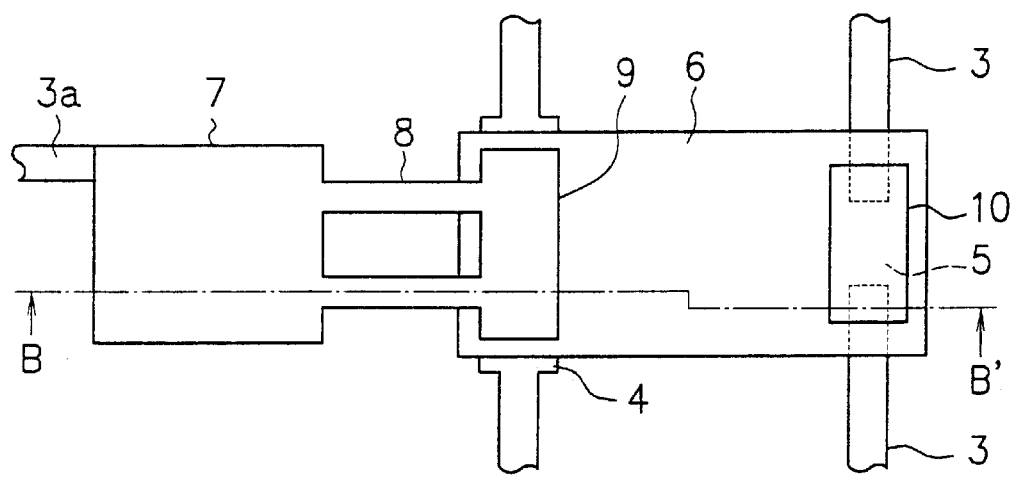
(a) SECOND EMBODIMENT
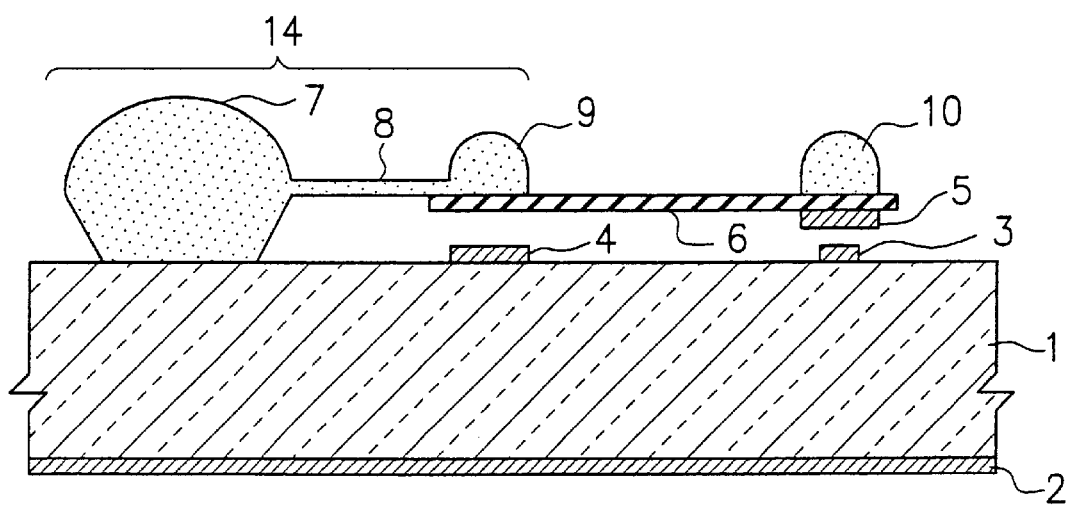
(b) B-B' CROSS-SECTIONAL VIEW

FIG. 7
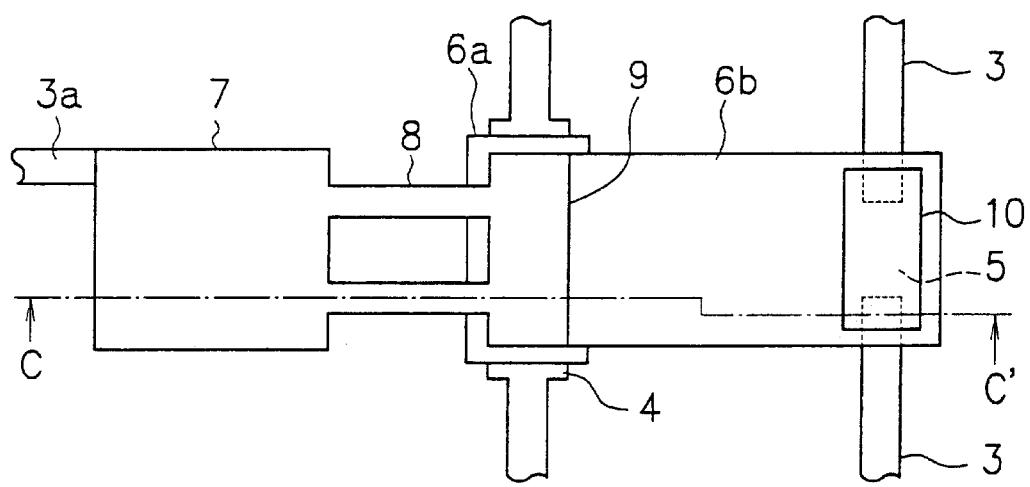
(a) THIRD EMBODIMENT
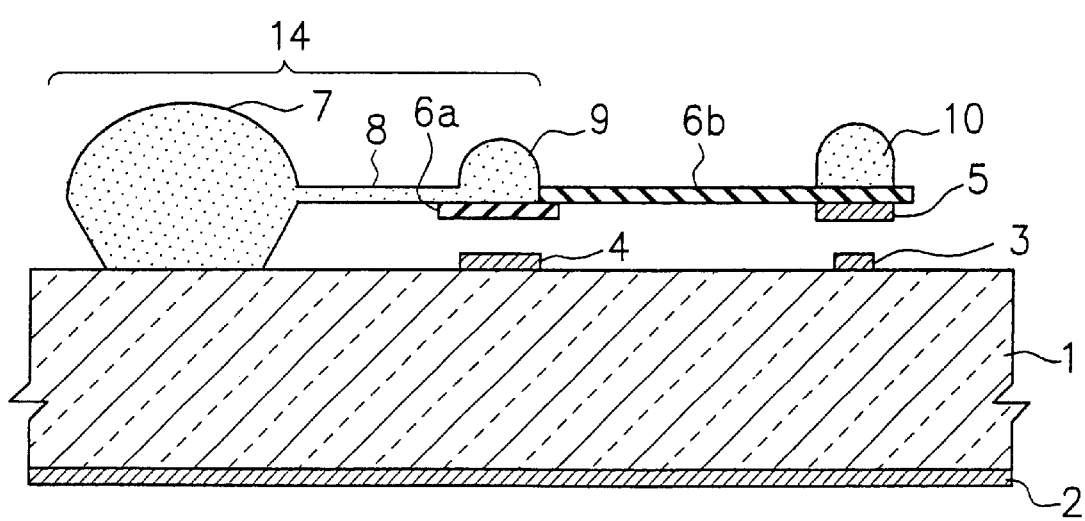
(b) C-C' CROSS-SECTIONAL VIEW

FOURTH EMBODIMENT

FIFTH EMBODIMENT

SIXTH EMBODIMENT

SEVENTH EMBODIMENT

F I G. 13
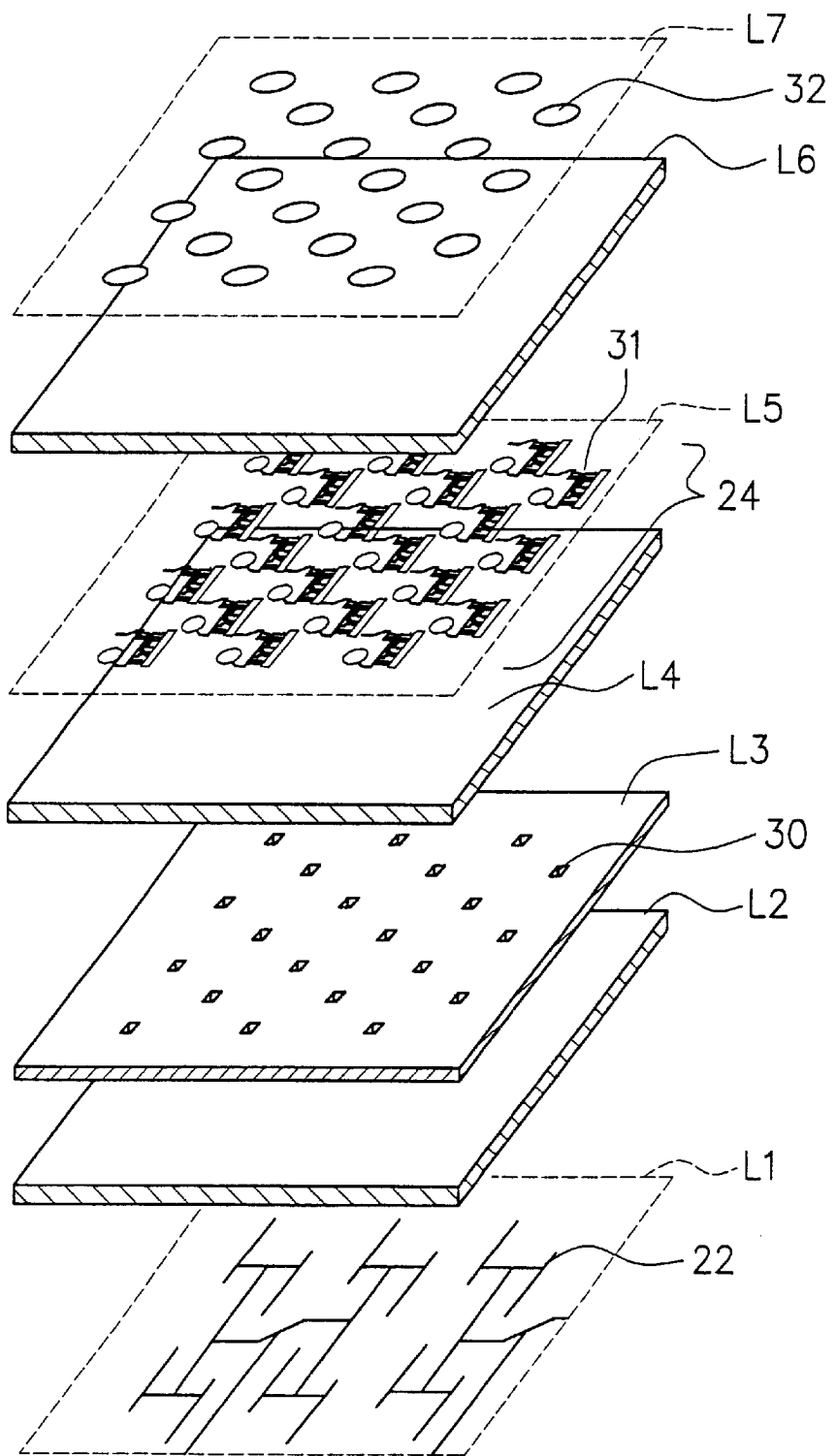

FIG. 16
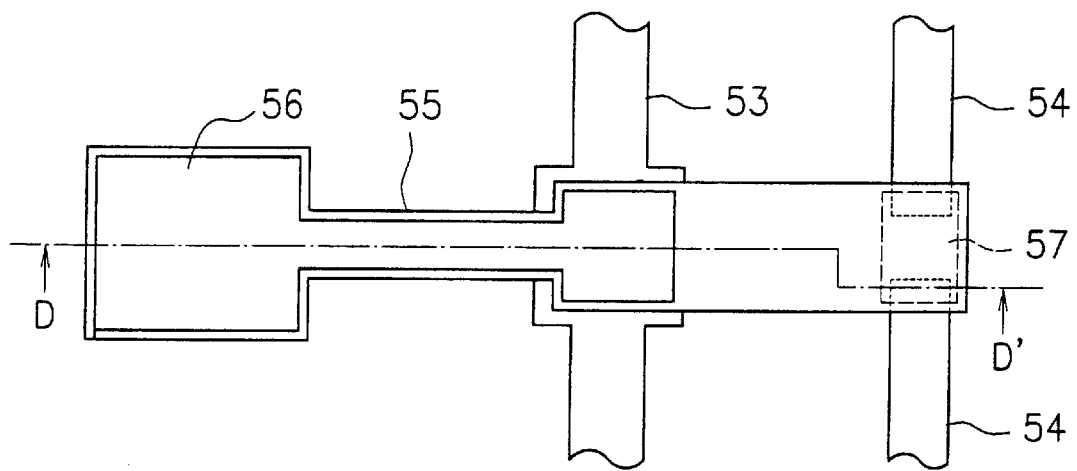
(a) PRIOR ART
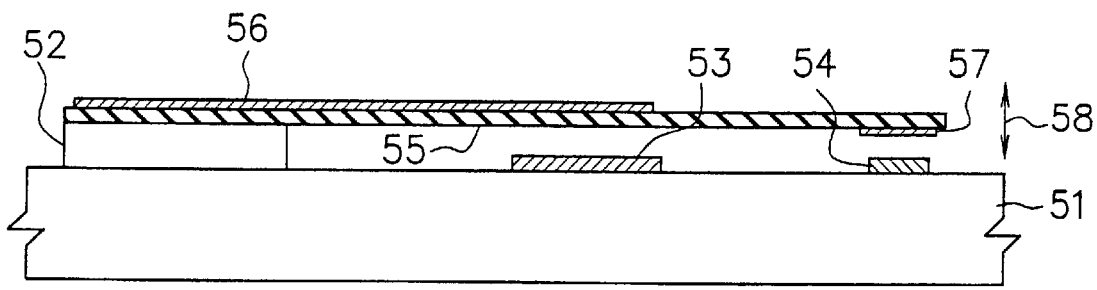
(b) D-D' CROSS-SECTIONAL VIEW

MICROMACHINE SWITCH AND ITS PRODUCTION METHOD

TECHNICAL FIELD

The present invention relates to a micro machine switch and a method for manufacturing thereof and in particular to a micro machine switch which allows the on/off control of a wide range of signal frequency, that is, from DC (direct current) signal frequency to signal frequency of one or more giga Hertz and a method for manufacturing thereof.

BACKGROUND ART

In the following the prior art will be described taking the case of the invention described in "Micro Electromechanical Switch", by Yun Jason Yao, ROCKWELL INTERNATIONAL CORPORATION (Japanese Patent Laid-Open No. Hei9-17300).

FIGS. 16(a) and 16(b) are a plan view of the micro machine switch disclosed in Japanese Patent Laid-Open Hei9-17300 and a cross-sectional view of the same taken along the line D–D', respectively. As shown in the same figures, an anchor structure 52 comprising thermosetting polyimide, a lower electrode 53 composed of gold and signal lines 54 comprising gold are provided on a substrate 51 comprising gallium arsenide.

And on the anchor structure 52 provided is a cantilever arm 55 consisting of silicon oxide, which extends to the signal lines 54 across the lower electrode 53 and faces the same with a space left between them.

An upper electrode 56 comprising aluminium is formed on the top of the cantilever arm 55 in such a position so as to face the anchor structure 52 and the lower electrode 53. And a contact electrode 57 comprising gold is provided on the bottom of the cantilever arm 55 in such a position so as to face the signal line 54.

In the micro machine switch having such construction, when applying a voltage of 30 V between the upper electrode 56 and the lower electrode 53, the force of attraction is applied to the upper electrode 56 in the direction of the substrate (downward in the direction shown by the arrow 58 by the electrostatic force). Therefore, the cantilever arm 55 is strained toward the substrate side; as a result, the contact electrode 57 comes in contact with both ends of the signal lines 54.

In the normal state, a space is provided between the contact electrode 57 and the signal lines 54, as shown in FIG. 16(b); accordingly, the two signal lines 54 are separated from each other. Thus, in state where no voltage is applied to the lower electrode 53, no current flows through the signal lines 54.

On the other hand, in state where voltage is applied to the lower electrode 53 and the contact electrode 57 is in contact with the signal lines 54, the two signal lines 54 short-circuit, which allows current to flow between them. Thus, the application of voltage to the lower electrode 53 allows the on/off control of the electric current or signals passing through the signal lines 54.

However, in order to reduce the switch loss particularly when using the switch for the signals in the microwave range, it is important that the upper electrode 56 and the contact electrode 57 are well insulated from each other. In other words, if the upper electrode 56 and the contact electrode 57 short-circuit, signals (including DC) flowing through the signal lines 54 flow out even to the upper electrode 56.

Even if the upper electrode 56 and the contact electrode 57 do not short-circuit, in state where electrostatic capacity is significantly large, alternate signals flowing through the signal lines 54 also flow out to the upper electrode 56 and leak outside.

As described above, when the upper electrode 56 and the contact electrode 57 are not well insulated, the leak of signals becomes large, and switching characteristics deteriorate. From this viewpoint, the prior art described above uses an insulating material (silicon oxide) as the material constituting the cantilever arm 55.

The micro machine switch of the prior art described above has the following problems.

The cantilever arm 55 is contact with the upper electrode 56 and the anchor structure. 52, both of which differ from the cantilever arm 55 in the material, over a wide range. Further, the cantilever arm 55 is designed to have a mechanically flexible construction so as to control the driving voltage of the switch and to move only by applying micro voltage.

As described above, since the upper electrode 56, the cantilever arm 55 and the anchor structure 52 are formed of different materials, their thermal expansion coefficients are also different, and particularly in the cantilever arm 55, warps are likely to be caused due to distortion.

For example, when comparing silicon dioxide, aluminium and polyimide, the thermal expansion coefficient of silicon dioxide is about 1/100 times as small as those of the other two. Therefore, the metal portion of the upper electrode 56 etc. expands with the changes in the processing temperature and the atmospheric temperature after the completion of a device, and thereby warps are easily caused in the cantilever arm 55.

The existence of such warps has a bad influence on switching characteristics regardless of their direction relative to the substrate 51. In cases where the cantilever arm 55 warps upward, even if the bottom side surface of the cantilever arm 55 comes in contact with the lower electrode 53 by the application of voltage, a state is likely to occur in which the contact electrode 57 does not come in contact with the signal lines 54. In that case, even if the contact electrode 57 comes in contact with the signal lines 54, the intensity of pressure applied to the contact portion is very small, and such a very light contact gives rise to a problem of increasing the contact resistance of the switch.

On the other hand, in cases where the cantilever arm 55 warps downward, although the contact electrode 57 surely comes in contact with the signal lines 54 due to application of a voltage, the entire contact electrode does not come in planar contact with the signal lines 54, and what is called single contact (both come in contact with each other only at one area) is very likely to occur. Thus, even in this case, there arises a problem of increasing the contact resistance of the switch.

As described above, in any case, a problem is created such that warps caused in the cantilever arm 55 increase the contact resistance, resulting in increasing the switch resistance when the switch is in the on state.

In fact, in the micro machine switch according to the prior art, the switch production process is performed at a low temperature of 250° C. or lower, and thereby warps caused due to the processing temperature are controlled.

To be concrete, a silicon dioxide film for making up the cantilever arm 55 is formed by the plasma enhanced CVD (PECVD) process. A PECVD oxide film offers the advantage of being able to be formed at low temperatures, and keeping the processing temperature low is important when decreasing the influence of the big difference in thermal expansion coefficient from material to material.

On the other hand, it is well known that mechanical properties (distortion, rigidity, reliability, etc.) and electrical properties (dielectric constant, maximum breakdown voltage, etc.) of materials can be remarkably improved by the optimization of, particularly, temperature conditions.

However, in the micro machine switch according to the prior art as described above, since the processing temperature needs to be kept low, the temperature parameter cannot be made good use of for optimizing the materials. In this respect, the prior art can be said to be limited largely in material.

Generally, a cantilever arm has the advantage that the width of its arm can be decreased when increasing its thickness so as to keep the rigidity constant. Thus, it has another advantage that the dimensions of the entire switch can be decreased, therefore, multiple switches can be formed in a limited area.

However, in the micro machine switch according to the prior art, which utilizes silicon dioxide for the cantilever arm, it is limited largely in the thickness of the cantilever arm 55. In principle, the thickness of silicon dioxide film can be increased to 10 μm or more by increasing the PECVD duration; however, increasing the growth duration means decreasing the processing rate of the PECVD system, which results in increasing costs and giving rise to various problems involving the maintenance of the system, for example, such that cleaning is often required since dust is likely to be caused.

Further, inside the thick film a large amount of distortion is caused, which gives rise to a problem of fracturing the substrate 51 during the deposition of silicon dioxide. For the reasons as above, the actual situation is such that the thickness of the cantilever arm is limited to about 2 μm at most. Thus the micro machine switch according to the prior art is strictly limited in design dimensions of its construction.

In addition, the decrease in processing temperature as is performed in the prior art is effective to some extent in controlling warps caused during the manufacturing process, but not effective at all in controlling warps caused due to the variation in atmospheric temperature under which the micro machine is used. The problem of causing warps during the use of the micro machine is an inevitable consequence of using laminated films different in thermal expansion coefficient in the arm portion of the switch.

At the same time, the micro machine switch having the construction according to the prior art has the problems of mechanical strength and durability. When driving the switch, the highest stress is set up at the base of the cantilever arm 55 (at the portion where the cantilever arm 55 is connected to the anchor structure 52). Accordingly, in order to improve the mechanical strength and durability of the switch, it is necessary to optimize the structure of the base portion.

In the construction of the micro machine switch according to the prior art, the cantilever arm 55 and the anchor structure 52 are formed of different materials and placed perpendicularly to each other. And this construction is not suitable for relieving the stress given rise to at the base portion.

The present invention has been made so as to overcome the above problems, accordingly the object of the present invention is to provide a micro machine switch which can be mass-produced, is low-cost and is high-performance and a method for manufacturing thereof

DISCLOSURE OF THE INVENTION

In order to achieve the above object, one aspect of the micro machine switch according to the present invention relates to a micro machine switch for controlling the conduction/non-conduction between first and second signal lines which are provided on a substrate in such a manner as to leave a predetermined gap between their respective end portions. The micro machine switch as above includes: a supporting member provided on the above substrate in such a manner as to be adjacent to the above gap and to have a predetermined height with respect to the surface of the above substrate; a flexible beam member provided in such a manner as to project from the supporting member almost horizontally to the above substrate surface and to extend so far that its part faces the above gap; a contact electrode provided on the substrate side of the above beam member in such a position as to face the above gap, and a lower electrode provided on the above substrate in such a manner as to face part of the above beam member. Part of the above beam member, which ranges from the portion at which it is connected to the above supporting member to the portion facing the above lower electrode, is allowed to be conductive, and hence to function as an upper electrode. And the thermal expansion coefficients on the substrate side of the above beam member and on the opposite side of the same are allowed to be almost symmetric in the thickness direction perpendicular to the above substrate surface, at least in the region ranging from the portion at which it is connected to the above supporting member to the portion facing the above lower electrode.

In another aspect of the micro machine switch according to the present invention, the angle made between the substrate side surface of the above beam member and the surface of the above supporting member to which the above beam member is connected is an obtuse angle.

In another aspect of the micro machine switch according to the present invention, the above supporting member protrudes higher than the surface of the above beam member opposite to the substrate side surface of the same, at the portion both members are connected to each other.

In another aspect of the micro machine switch according to the present invention, the angle made between the beam member surface opposite to the substrate side surface of the same and the surface of the above supporting member protruding higher than the above beam member surface is an obtuse angle.

In another aspect of the micro machine switch according to the present invention, the angle made between the substrate side surface of the above beam member and the side surface of the above supporting member to which the above beam member is connected is an obtuse angle.

In another aspect of the micro machine switch according to the present invention, the above contact electrode is provided on the above substrate side of the above beam member via an insulating member.

Another aspect of the micro machine switch according to the present invention is characterized in that on the surface of the above beam member, which is opposite to the surface provided with the above contact electrode, a reinforcing member is provided in such a manner as to face the above contact electrode.

In another aspect of the micro machine switch according to the present invention, the above contact electrode is coated with an insulating material film capable of capacity connecting to the above first and second signal lines.

In another aspect of the micro machine switch according to the present invention, the above lower electrode is provided on the above substrate in such a position so as to be between the above supporting member and the above gap.

In another aspect of the micro machine switch according to the present invention, the above supporting member and at least part of the above beam member are formed of the same conductive material as an integral unit.

In another aspect of the micro machine switch according to the present invention, part of the above beam member, which ranges from the portion at which it is connected to the above supporting member at least to the portion facing the above lower electrode, is formed of a conductive member and on the tip portion of the conductive member an insulating member is provided which extends to the position facing the above gap, the above contact electrode being provided on the insulating member in such a manner as to face the above gap.

In another aspect of the micro machine switch according to the present invention, the above conductive member consists of a semiconductor material.

In another aspect of the micro machine switch according to the present invention, the above beam member consists of a semiconductor material and at least the region ranging from the portion at which the above contact electrode is provided to the portion facing the above lower electrode is insulated.

In another aspect of the micro machine switch according to the present invention, the above semiconductor material is a single crystal semiconductor.

In another aspect of the micro machine switch according to the present invention, the above semiconductor material is an amorphous semiconductor or polycrystalline semiconductor.

In another aspect of the micro machine switch according to the present invention, the above substrate is a glass substrate or a ceramic substrate.

In another aspect of the micro machine switch according to the present invention, the above substrate is a gallium arsenide substrate.

Another aspect of the micro machine switch according to the present invention is used in a phased array antenna system.

One aspect of the method for manufacturing a micro machine switch according to the present invention relates to a method for manufacturing a micro machine switch for controlling the conduction/non-conduction between first and second signal lines which are provided on a substrate in such a manner as to leave a predetermined gap between their respective end portions. The method includes: a step of forming a lower electrode on the above substrate; and a step of bonding a member, which consists of a supporting member having a predetermined height, a flexible beam member provided on the supporting member and a contact electrode provided on the beam member, to the above substrate while allowing the above contact electrode to face the above gap and to be spaced apart from the first and second signal lines. The above beam member is formed in such a manner that its part, which ranges from the portion at which it is connected to the above supporting member to the portion facing the above lower electrode, is allowed to be conductive and hence to function as an upper electrode and that the thermal expansion coefficients of its both sides, at least the region ranging from the portion at which it is connected to the above supporting member to near the portion facing the above lower electrode, are allowed to be almost symmetric in the thickness direction perpendicular to the above substrate surface.

In another aspect of the method for manufacturing a micro machine switch according to the present invention, the angle between the substrate side surface of the above beam member and the surface of the above supporting member to which the above beam member is connected is made an obtuse angle.

In another aspect of the method for manufacturing a micro machine switch according to the present invention, the above supporting member is formed in such a manner as to protrude higher than the surface of the above beam member opposite to the substrate side surface of the same, at the portion both members are connected o each other.

In another aspect of the method for manufacturing a micro machine switch according to the present invention, the angle between the beam member surface opposite to the substrate side surface of the same and the surface of the above supporting member protruding higher than the above beam member surface is made an obtuse angle.

In another aspect of the method for manufacturing a micro machine switch according to the present invention, the angle between the substrate side surface of the above beam member and the side surface of the above supporting member to which the above beam member is connected is made an obtuse angle.

In another aspect of the method for manufacturing a micro machine switch according to the present invention, the above contact electrode is provided on the above substrate side of the above beam member via an insulating member.

In another aspect of the method for manufacturing a micro machine switch according to the present invention, on the surface of the above beam member opposite to the surface of the same which is provided with the above contact electrode, a reinforcing member is provided in such a manner as to face the above contact electrode.

In another aspect of the method for manufacturing a micro machine switch according to the present invention, the above contact electrode is coated with an insulating material film capable of capacity connecting to the above first and second signal lines.

In another aspect of the method for manufacturing a micro machine switch according to the present invention, the above lower electrode is provided on the above substrate in such a position so as to be between the above supporting member and the above gap.

In another aspect of the method for manufacturing a micro machine switch according to the present invention, the above supporting member and at least part of the above beam member are formed of the same conductive material as an integral unit.

In another aspect of the method for manufacturing a micro machine switch according to the present invention, part of the above beam member, from the portion at which it is connected to the above supporting member at least to the portion facing the above lower electrode, is formed of a conductive member and on the tip portion of the conductive member an insulating member is provided which extends to the position facing the above gap, the above contact electrode being provided on the insulating member in such a manner as to face the above gap.

In another aspect of the method for manufacturing a micro machine switch according to the present invention, the above conductive member is formed of a semiconductor material.

In another aspect of the method for manufacturing a micro machine switch according to the present invention, the above beam member is formed of a semiconductor material and at least the region ranging from the portion at which the above contact electrode is provided to the portion facing the above lower electrode is insulated.

In another aspect of the method for manufacturing a micro machine switch according to the present invention, a single crystal semiconductor is used as the above semiconductor material.

In another aspect of the method for manufacturing a micro machine switch according to the present invention, an amorphous semiconductor or polycrystalline semiconductor is used as the above semiconductor material.

In another aspect of the method for manufacturing a micro machine switch according to the present invention, a glass substrate or a ceramic substrate is used as the above substrate.

In another aspect of the method for manufacturing a micro machine switch according to the present invention, a gallium arsenide substrate is used as the above substrate.

In another aspect of the method for manufacturing a micro machine switch according to the present invention, the above micro machine switch is used in a phased array antenna system.

In the micro machine switch of the present invention constructed as described above, thermal expansion coefficients of the both side of the beam member material are almost symmetric in the thickness direction perpendicular to the substrate surface. Accordingly, warps caused due to the distortion occurring between different materials, as seen in the micro machine switch of the prior art, are considerably relieved. The simplest method for allowing the thermal expansion coefficients to be symmetric in the thickness direction is to form the beam member of only one material. It goes without saying that the beam member can also be formed to have a laminated structure which is symmetric in the vertical direction.

In order to suppress warps caused in the beam member, it is effective to allow the thermal expansion coefficients to be symmetric as described above particularly in the neighborhood of the portion at which the beam member is connected to the supporting member, more concretely, in the region ranging from the portion at which the beam member is connected to the supporting member at least to the portion facing the lower electrode. Conversely, in the neighborhood of the tip portion of the beam member, even if the thermal expansion coefficients are not symmetric in the thickness direction, warps are not very large.

When making measurements for the experimentally manufactured switches, it was found that the variation in contact resistance created due to single contact etc. was narrowed and thereby a large amount of switches uniform in characteristics could be manufactured.

It was also found that the change in switching operation was considerably small even if the ambient temperature of the switch changed.

Further, the micro machine switch according to the construction of the present invention has been improved in mechanical strength, durability and operational speed, compared with that of the prior art. For example, allowing the angle between the beam member and the supporting member on the substrate side to be an obtuse angle makes it possible to prevent the base of the beam member from being fractured by a stress concentration. Allowing the supporting member to protrude higher than the beam member makes it possible to give the structure in the neighborhood of the base of the beam member a shape which is almost symmetric in the vertical direction. This allows the thermal expansion coefficient distribution in the neighborhood of the base of the beam member, including the supporting member, to be symmetric, which is effective in preventing warps caused in the beam member.

The upward protrusion of the supporting member effectively improves the operational speed of the switch. Specifically, it is effective in increasing the speed of the switch's returning motion, from the on state (the state in which the switch is dropped) to the off state (the state in which the switch is raised). This is because stresses set up at the base of the beam member become larger when the supporting member protrudes higher than the beam member. When turning on/off the switch, since the operation is very rapid, a phenomenon can sometimes occur that the beam member vibrates up and down (referred to as bound chattering). In order to stop this bound chattering promptly, it is necessary to let the supporting member absorb the kinetic energy of the beam member by setting up a moderate stress at the base of the beam member, and for this purpose, the structure is effective in which the supporting member protrudes higher than the beam member.

In the micro machine switch as above, the beam member is weakest of all the members in terms of the mechanical strength. Accordingly, the micro machine switch preferably has a structure which allows preventing the beam member from fracturing due to the contact with the substrate etc. when mounting the same on the substrate in its manufacturing process. Thus, if the micro machine switch is constructed in such a manner that the supporting member protrudes higher than the beam member, the contact accidents of the beam member can be suppressed, and thereby the likelihood of fracturing the switch can be reduced.

And when protruding the supporting member higher than the beam member, preferably the angle between the surface of the beam member and that of the supporting member on the opposite side to the substrate is allowed to be an obtuse angle, because doing so allows preventing the base of the beam member from fracturing due to a stress concentration. When the angles between the beam member and the supporting member are allowed to be obtuse angles both on the substrate side and on the opposite side to the substrate, both of the angles are preferably in the range of 100° to 170°, more preferably 110° to 150° This allows the effect of decreasing a stress concentration as described above and the effect of setting up an appropriate stress to improve the operational speed to be compatible with each other.

Forming the supporting member and part of the beam member including at least the base portion of the same material allows reducing of the warps caused between the two members, suppressing of a stress concentration on one point and improving the strength of the micro machine switch, which results in improving the durability of the micro machine switch. And if the supporting member, the beam member and the upper electrode are all formed of the same material, the manufacturing process can be simplified.

Further, since the high-temperature process can be utilized, the number of alternatives for the materials constituting the beam member etc. is increased and various types conductors and semiconductors can be utilized, thus the degree of freedom of selecting material is increased. The insulating film formed at high temperatures in particular is excellent in resistance to pressure, this may contribute to electrical characteristics of devices.

Further, since the degree of freedom of the beam member (cantilever arm) is increased in the thickness direction, the width of the arm can be decreased, and thereby the size of the switch can also be decreased.

The beam member constituting the micro machine switch of the present invention is conductive at least for the part ranging from the portion at which it is connected to the supporting member to the position facing the lower electrode, and the "conductive" materials herein used are not limited to conductors such as metals. The point is whether or not voltage can be applied through the supporting member to such a position of the beam member so as to face the lower electrode, and current hardly flow this portion. Accordingly, as the materials for use in the part of the beam member ranging from the portion at which it is connected to the supporting member to such a position so as to face the lower electrode, a wide variety of materials such as metals- and semiconductors can be adopted. And when using semiconductor materials, the presence and the concentration of impurities added can be changed widely.

Because of the excellent effects as described above, the micro machine switch of the present invention can be applied not only to a simple switch which uses only a single micro machine switch, but also to a phased array antenna system which requires micro machine switches of order of tens of thousands to be integrated on a large area of substrate.

BRIEF DESCRIPTION OF THE DRAWINGS

FIG. 1(a) is a plan view of the micro machine switch according to a first embodiment of the present invention and FIG. 1(b) is a cross-sectional view of the micro machine switch of FIG. 1(a) taken along the line A–A';

FIGS. 3(e), 3(f) and 3(g) are cross-sectional views illustrating the manufacturing process of the micro machine switch of FIGS. 1(a) and 1(b), which are the continuation of FIGS. 2;

FIG. 4(a) is a plan view of the micro machine switch according to a second embodiment of the present invention and FIG. 4(b) is a cross-sectional view of the micro machine switch of FIG. 4(a) taken along the line B–B';

FIG. 7(a) is a plan view of the micro machine switch according to a third embodiment of the present invention and FIG. 7(b) is a cross-sectional view of the micro machine switch of FIG. 7(a) taken along the line C–C';

FIG. 13 is an exploded perspective view illustrating the detailed configuration of the phased array antenna system of FIG. 12;

FIG. 16(a) is a plan view of one example of the micro machine switches according to the prior arts and FIG. 16(b) is a cross-sectional view of the micro machine switch of FIG. 16(a) taken along the line D–D'.

BEST MODE FOR CARRYING OUT THE INVENTION

Figure 2:
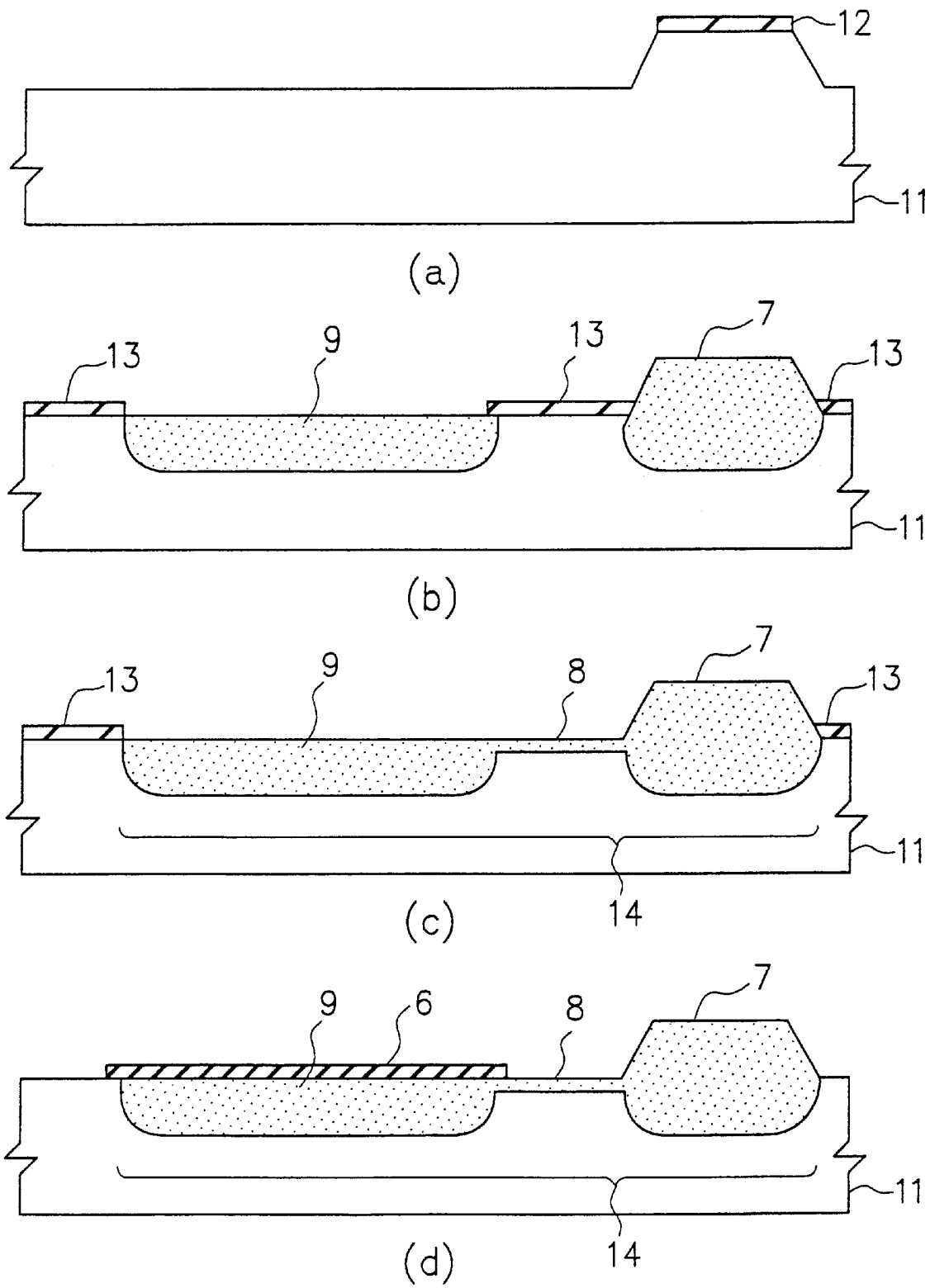
FIGS. 2(a) to 2(d) are cross-sectional views illustrating the manufacturing process of the micro machine switch of FIGS. 1(a) and 1(b)

In the following the embodiments of the present invention will be described with reference to the accompanying drawings.

First Embodiment

Referring to FIGS. 1(a) and 1(b), there are shown a plan view of the micro machine switch according to a first embodiment of the present invention and a cross-sectional view of the micro machine switch of FIG. 1(a) taken along the line A–A', respectively. As shown in the same figures, in the micro machine switch according to this embodiment, a switch body 14 consisting of silicon, a lower electrode 4 comprising gold and signal lines 3 comprising gold are provided on a glass substrate with a high dielectric constant. And an earth plate 2 is formed on the back side of the substrate 1.

The switch body 14 consists of a supporting member 7, cantilever arms 8 and an upper electrode 9 as an integral unit. From the supporting member 7, two cantilever arms 8 consisting of silicon extend almost horizontally to the substrate surface. The use of two cantilever arms 8 allows keeping rotational motion of the arms low compared with the use of only one cantilever arm, than the case of the micro machine switch according to the prior art, and contributes to the prevention of single contact of the switch. However, the number of the cantilever arms 8 may be changed depending on the conditions, and the present invention includes the micro machine switch construction: having one cantilever arm 8 and having two or more cantilever arms 8.

At the portion where the supporting member 7 and the cantilever arms 8 are connecting to each other, preferably the angles $\alpha$, $\beta$ between the surface of the supporting member 7 and the surfaces of the arms 8 are adjusted to be respective obtuse angles (90°<$\alpha$, $\beta$<180°). This adjustment allows increase in the strength of the cantilever arms 8, and hence switching operations can be done at frequency as high as 1 MHz or more.

At the tip of each cantilever arm 8 provided is the upper electrode 9 made of silicon, which faces the lower electrode 4 with a gap left between them.

The supporting member 7 is connected to a signal line 3a formed on the substrate 1, the signal line 3a being electrically connected to the upper electrode 9 via the supporting member 7 and the cantilever arms 8.

And an insulating member 6 comprising an insulating film of, for example, silicon dioxide or silicon nitride is provided on the bottom surface of the upper electrode 9 in such a manner as to extend from the position facing the lower electrode 4 to the position facing the signal lines 3. In the position, which faces the signal lines 3, of the bottom surface of the insulating member 6 provided is a contact electrode 5 comprising gold.

Providing the insulating member 6 as above allows the prevention of short circuit between the contact electrode 5 and the upper electrode 9 as well as the contact of the upper electrode 9 with the lower electrode 4 during the switching operation. The insulating member 6, however, has only to be provided at least between the contact electrode 5 and the upper electrode 9. When switching high frequency signals, the surface of the contact electrode 5 may be coated with an insulating material film as long as it can be subjected to capacitive coupling with the signal lines 3. Conversely, the signal lines 3 may be coated with an insulating material film.

As described above, since the top of the insulating member 6, which is opposite to the contact electrode 5, is provided with the upper electrode 9 thicker than the cantilever arm 8, warps caused between the contact electrode 5 and the insulating member 6 due to distortion can be kept small. Accordingly, the contact electrode 5 can always be kept parallel to the substrate 1, and thereby increase in contact resistance due to single contact can be suppressed.

Now the embodiment will be described in terms of its operation.

When applying a voltage of 30 V between the upper electrode 9 and the lower electrode 4 through the signal line 3a, the force of attraction is applied to the upper electrode 9 in the direction of the substrate (downward) by an electrostatic force. Therefore, the cantilever arms 8 are curved downward; as a result, the contact electrode 5 comes in contact with both ends of the signal lines 3.

The two signal lines 3 are separated by a space 15 in such a position as to face the contact electrode 5, as shown in FIG. 1(b). Accordingly, in state where no voltage is applied, no current flows through the signal lines 3. However, when voltage is applied and the contact electrode 5 is in contact with the signal lines 3, current flows through the signal lines 3. Thus the application of voltage to the lower electrode 4 allows the on/off control of current flowing through the signal lines 3 loss was 3 to 4 dB with the HEMT (High Electron Mobility Transistor) switch in current use, it is obtained that the insertion loss is 2.5 dB with the switch according to this embodiment.

In the micro machine switch according to this embodiment, since the upper electrode 9 is electrically connected to the conductive supporting member 7 via the conductive cantilever arms 8, as described above, the application of voltage thereto can be easily performed. However, the upper electrode 9 may be in the electrically floating state. In that case, the signal line 3a is not necessary, and operating the switch only requires the application of voltage to the lower electrode 4.

The supporting member 7, the cantilever arms 8 and the upper electrode 9 can be formed of a semiconductor part of which or the entire portion of which has impurities diffused therein. In that case, since the amount of electricity flowing between the upper electrode 9 and the lower electrode 4 is extremely small, it is unnecessary to precisely control the content of the impurities in the semiconductor.

As described in the following method for manufacturing the micro machine switch, the thickness of the cantilever arms 8 can be easily controlled to be smaller than the other constituents. Controlling the thickness of each component allows forming of relatively flexible cantilever arms 8 among highly rigid constituents. Thus, distortion caused in the highly rigid constituents at the time of applying voltage is horizontal to the substrate 1, and distortion mostly occurs in the cantilever arms 8, of which thickness is relatively small. This contributes to keeping the occurrence of single contact of the switch rare.

However, it is to be understood that the micro machine switches of which upper electrode 9 has the same thickness as that of the cantilever arms 8 are also within the scope of the present invention. Such construction offers the advantage of allowing the manufacturing method to be simplified.

The typical dimensions of the constituents according to this embodiment are shown in Table 1.

TABLE 1

|  | Width (Longitudinal direction) | Length (Lateral direction) | Thickness |
| --- | --- | --- | --- |
| Cantilever arms 8 | 5 $\mu$m | 60 $\mu$m | 3 $\mu$m |
| Upper electrode 9 | 100 $\mu$m | 200 $\mu$m | 10 $\mu$m |
| Contact electrode 5 | 70 $\mu$m | 10 $\mu$m | 1 $\mu$m |

In the table, the term "Width" means the longitudinal length in terms of the plan view of FIG. 1(a), the term "Length" the lateral length in terms of the plan view of FIG. 1(a), and the term "Thickness" the longitudinal length in terms of the cross-sectional view of FIG. 1(b).

However, it is to be understood that these dimensions should be designed depending on the applications and are not intended to limit the present invention. The present invention allows a wide range of design, due to its increased degree of design freedom.

Now the manufacturing process of the micro machine switch of FIGS. 1(a) and 1(b) will be described with reference to the drawings.

Referring to FIGS. 2(a), 2(b), 2(c), 2(d), 3(e), 3(f) and 3(g), there are shown cross-sectional views illustrating the manufacturing process of the micro machine switch of FIGS. 1(a) and 1(b). The manufacturing process will be described in order.

First, as shown in FIG. 2(a), a pattern 12 consisting of silicon dioxide film is formed on a substrate 11 consisting of silicon, then the substrate 11 is etched to a depth of about 6 $\mu$m with an etchant such as tetramethylammonium hydroxide (TMAH).

When using silicon of which crystal face is expressed mainly by (100), due to the crystal orientation dependency of etching rate, a trapezoid is formed in which (111) face is exposed as the side surfaces.

Then, as shown in FIG. 2(b), a pattern 13 is newly formed on the substrate 11 so as to use it as a mask, then boron is diffused in the substrate region without a mask, and thermal diffusion is performed, for example, at 1150° C. for about 10 hours so as to diffuse boron deeply. This allows high-concentration boron to be diffused to a depth of about 10 $\mu$m. As a result, a supporting member 7 and an upper electrode 9 are formed.

Then, as shown in FIG. 2(c), the pattern 13 is removed from the region corresponding to cantilever arms 8, and while using the rest of the pattern 13 as a mask, boron is diffused in the substrate region without the mask. Thus, a switch body 14 comprising a supporting member 7, cantilever arms 8 and an upper electrode 9 is completed.

This time, thermal diffusion is performed, for example, at 1150° C. for about 2 hours so as to diffuse boron shallowly. This allows high-concentration boron to be diffused to a depth of about 2 $\mu$m.

Then, as shown in FIG. 2(d), an insulating member 6 comprising 1 $\mu$m silicon dioxide and 0.05 $\mu$m nitride film is formed on the upper electrode 9.

Then, as shown in FIG. 3(e), a contact electrode 5 is formed on the insulating member 6 by the use of gold plating.

And as shown in FIG. 3(f), the substrate 11 formed as above is placed on a glass substrate 11 with a lower electrode 4 comprising gold and signal lines 3 and 3a both comprising gold formed thereon. The substrate 1 is previously formed using the process different from that used in silicon substrate processing. Then the supporting member 7 is bonded to the substrate 1. For bonding silicon and glass to each other, an electrostatic bonding technique can be used.

Finally, as shown in FIG. 3(g), the substrate 11 is dipped into an etchant with high boron-concentration selectivity, such as ethylenediaminepyrocatechol, so as to dissolve the portion in which no boron is diffused. Thus, a micro machine switch can be formed on the substrate 1.

When the substrate 1 is formed of ceramic or gallium arsenide, the supporting member 7 and the substrate can be bonded to each other with a bond. Alternatively, an electrostatic bonding technique can also be used if the surface of the substrate is sputtered with glass to the thickness of about 2 to 5 $\mu$m.

As described above, the micro machine switch according to this embodiment, the switch body 14 including the cantilever arms 8 etc. is formed by etching a single crystal silicon substrate. And the micro machine switch according to this embodiment offers the advantage of being able to produce the most reliable construction in terms of mechanical properties, because it utilizes a single crystalline substance as a material.

Further, since the cantilever arms 8 are formed of a single crystalline substance alone, warps are never caused due to the difference in thermal expansion coefficient, unlike the cantilever arm structure according to the prior art in which a plurality of materials are bonded together. Specifically, the occurrence of warps are suppressed by allowing the changes in thermal expansion coefficient in the direction perpendicular to the surface of the substrate 1 to be symmetric with respect to the line passing through the cantilever arm lengthwise.

Alternatively, a switch having the same construction as the present invention can be formed by depositing any other type thin film on a substrate 1 and utilizing selective etching. For example, the switch body 14 may be formed not of single crystal silicon, but of amorphous silicon, polycrystalline silicon or highly resistant semiconductor materials (GaAs, iron doped InP, etc.). Further, the switch body 14 may be formed not of semiconductor, but of a metal such as gold or aluminium.

In the following the other embodiments of the present invention will be described with reference to the drawings.

Second Embodiment

Referring to FIGS. 4(a) and 4(b), there are shown a plan view of the micro machine switch according to a second embodiment of the present invention and a cross-sectional view of the micro machine switch of FIG. 4(a) taken along the line B–B', respectively. As shown in the same figures, in the micro machine switch according to this embodiment, a supporting member 7 consisting of silicon, a lower electrode 4 comprising gold and signal lines 3 comprising gold are provided on a glass substrate 1 with a high dielectric constant. And an earth plate 2 is formed on the back side of the substrate 1.

A switch body 14 consists of the supporting member 7, cantilever arms 8 and an upper electrode 9 as one integral unit. From the supporting member 7, two cantilever arms 8 consisting of silicon extend almost horizontally to the substrate surface. The use of two cantilever arms 8 allows keeping of the arms' rotational motion low compared with the use of only one cantilever arm, as in the case of the micro machine switch according to the prior art, and contributes to the prevention of single contact of the switch. However, the number of the cantilever arms 8 may be changed depending on the conditions, and the present invention includes the micro machine switch construction having one cantilever arm 8 and having two or more cantilever arms 8.

At the portion where the supporting member 7 and the cantilever arms 8 are connecting to each other, preferably the angles $\alpha$, $\beta$, between the surface of the supporting member 7 and the surfaces of the arms 8 are adjusted to be respective obtuse angles (90°<$\alpha$, $\beta$<180°). This adjustment allows increase in the strength of the cantilever arms 8, and hence switching operations at frequency as high as 1 MHz or more.

At the tip of each cantilever arm 8 provided is the upper electrode 9 made of silicon, which faces the lower electrode 4 with a gap left between them.

The supporting member 7 is connected to a signal line 3a formed on the substrate 1, the signal line 3a being electrically connected to the upper electrode 9 via the supporting member 7 and the cantilever arms 8.

And an insulating member 6 comprising an insulating film of, for example, silicon dioxide or silicon nitride extends from the bottom surface of the upper electrode 9 to the position facing the signal lines 3. In the position, which faces the signal lines 3, of the bottom surface of the insulating member 6 provided is a contact electrode 5 comprising gold. When switching high frequency signals, the surface of the contact electrode 5 may be coated with an insulating material film as long as it can be subjected to capacitive coupling with the signal lines 3. Conversely, the signal lines 3 may be coated with an insulating material film.

The top of the insulating member 6, which is opposite to the contact electrode 5, is provided with a reinforcing member 10. This is provided so that warps caused between the contact electrode 5 and the insulating member 6 due to distortion can be kept small. Providing the reinforcing member 10 allows keeping of the contact electrode 5 always parallel to the substrate 1, and hence suppressing of the increase in contact resistance due to single contact. The reinforcing member 10 is not always necessary depending on the materials or the film thickness of the insulating member 6, and the micro machine switch construction without a reinforcing member is also within the scope of the present invention.

Now the embodiment will be described in terms of its operation.

When applying a voltage of 30 V between the upper electrode 9 and the lower electrode 4, the force of attraction is applied to the upper electrode 9 in the direction of the substrate (downward). Therefore, the cantilever arms 8 are curved downward; as a result, the contact electrode 5 comes in contact with both ends of the signal lines 3.

The two signal lines 3 are separated by a space in such a position as to face the contact electrode 5, as shown in FIG. 4(b). Accordingly, in state where no voltage is applied, no current flows through the signal lines 3. However, when voltage is applied and the contact electrode 5 is in contact with the signal lines 3, current flows through the signal lines 3. Thus the application of voltage to the lower electrode 4 allows the on/off control of current flowing through the signal lines 3 or signals. When having treated signals of 30 GHz, the insertion loss was 3 to 4 dB with the HEMT (High Electron Mobility Transistor) switch in current use, but 0.2 dB with the switch according to this embodiment.

According to this embodiment, since the upper electrode 9 is electrically connected to the conductive supporting member 7 via the conductive cantilever arms 8, the application of voltage thereto can be easily performed. However, the upper electrode 9 may be in the electrically floating state. In that case, the signal line 3a is not necessary, and operating the switch only requires the application of voltage to the lower electrode 4.

The supporting member 7, the cantilever arms 8, the upper electrode 9 and the reinforcing member 10 can be formed of a semiconductor part of which or the entire portion of which has impurities diffused therein. In that case, since the amount of electricity flowing between the upper electrode 9 and the lower electrode 4 is extremely small, it is unnecessary to precisely control the content of the impurities in the semiconductor.

As described in the following method for manufacturing the micro machine switch, the thickness of the cantilever arms 8 can be easily controlled to be smaller than the other constituents. Controlling the thickness of each component allows forming of relatively flexible cantilever arms 8 among highly rigid constituents.

Thus, distortion caused in the highly rigid constituents at the time of applying voltage is horizontal to the substrate 1, and distortion mostly occurs in the cantilever arms 8, of which thickness is relatively small. This contributes to keeping the occurrence of single contact of the switch rare.

However, the micro machine switches whose upper electrode 9 and reinforcing member 10 have the same thickness as that of the cantilever arms 8 are also within the scope of the present invention. Such construction offers the advantage of allowing the manufacturing method to be simplified.

The typical dimensions of the constituents according to this embodiment are shown in Table 2.

TABLE 2

|  | Width (Longitudinal direction) | Length (Lateral direction) | Thickness |
| --- | --- | --- | --- |
| Cantilever arms 8 | 5 μm | 60 μm | 3 μm |
| Upper electrode 9 | 100 μm | 50 μm | 10 μm |
| Contact electrode 5 | 70 μm | 10 μm | 1 μm |

In the table, the term "Width" means the longitudinal length in terms of the plan view of FIG. 4(*a*), the term "Length" the lateral length in terms of the plan view of FIG. 4(*a*), and the term "Thickness" the longitudinal length in terms of the cross-sectional view of FIG. 4(*b*).

However, it is to be understood that these dimensions should be designed depending on the applications and are not intended to limit the present invention. The present invention allows a wide range of design, due to its increased degree of design freedom.

Now the manufacturing process of the micro machine switch of FIGS. 4(*a*) and 4(*b*) will be described with reference to the drawings.

Figure 5:
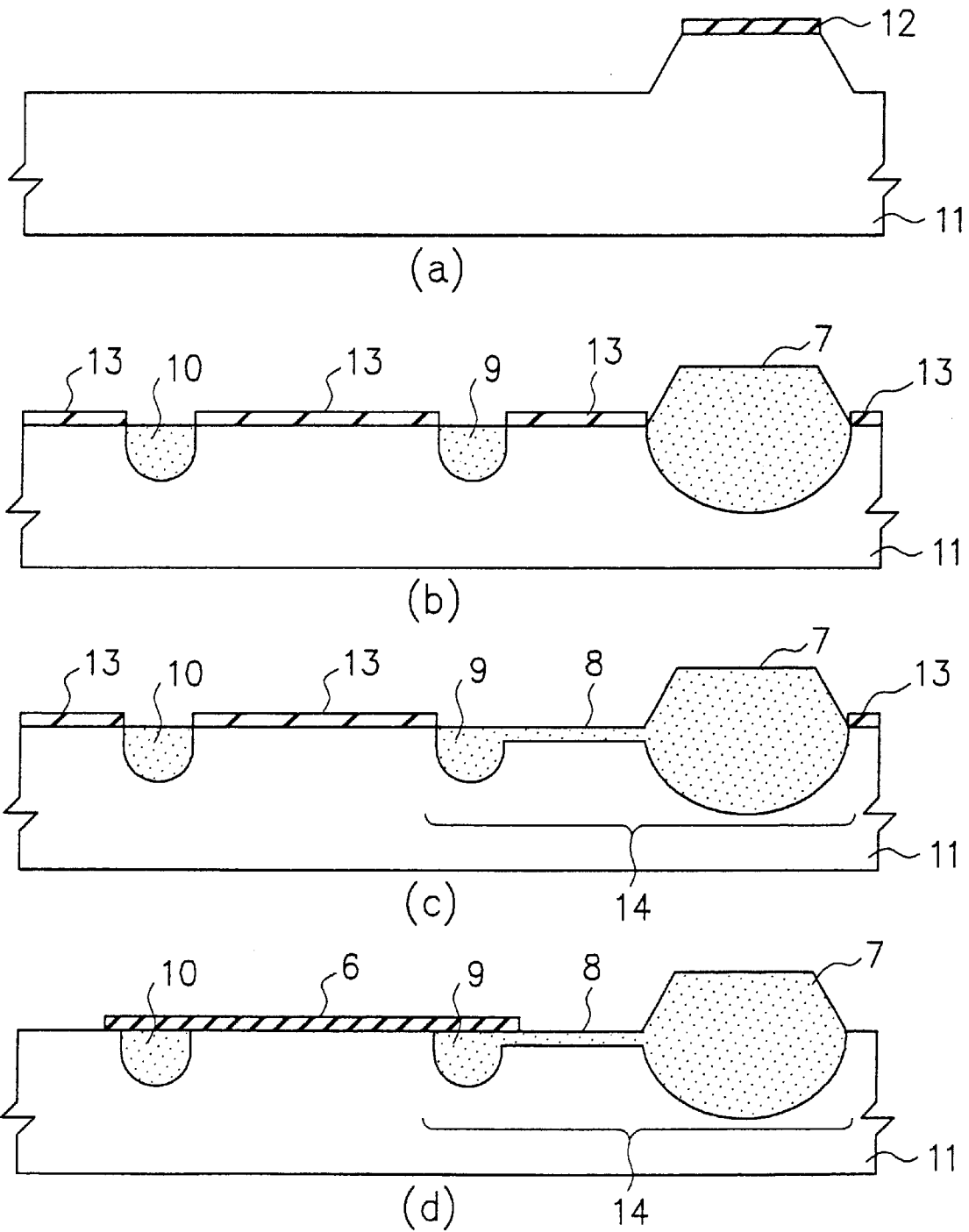
FIGS. 5(a) to 5(d) are cross-sectional views illustrating the manufacturing process of the micro machine switch of FIGS. 4(a) and 4(b)

Referring to FIGS. 5(*a*), 5(*b*), 5(*c*), 5(*d*), 6(*e*), 6(*f*) and 6(*g*), there are shown cross-sectional views illustrating the manufacturing process of the micro machine switch of FIGS. 4(*a*) and 4(*b*). The manufacturing process will be described in order.

First, as shown in FIG. 5(*a*), a pattern 12 consisting of silicon dioxide film is formed on a substrate 11 consisting of silicon, then the substrate 11 is etched to a depth of about 6 μm with an etchant such as tetramethylammonium hydroxide (TMAH).

When using silicon of which crystal face is expressed mainly by (100), due to the crystal orientation dependency of etching rate, a trapezoid is formed in which (111) face is exposed as the side surfaces.

Then, as shown in FIG. 5(*b*), a pattern 13 is newly formed on the substrate 1 so as to use it as a mask, then boron is diffused in the substrate region without a mask, and thermal diffusion is performed, for example, at 1150° C. for about 10 hours so as to diffuse boron deeply. This allows high-concentration boron to be diffused to a depth of about 10 μm. As a result, a supporting member 7, an upper electrode 9 and a reinforcing member 10 are formed.

Then, as shown in FIG. 5(*c*), the pattern 13 is removed from the region corresponding to cantilever arms 8, and while using the rest of the pattern 13 as a mask, boron is diffused in the substrate region without the mask. Thus, a switch body 14 comprising a supporting member 7, cantilever arms 8 and an upper electrode 9 is completed.

This time, thermal diffusion is performed, for example, at 1150° C. for about 2 hours so as to diffuse boron shallowly. This allows high-concentration boron to be diffused to a depth of about 2 μm.

Then, as shown in FIG. 5(*d*), an insulating member 6 comprising 1 μm silicon dioxide and 0.05 μm nitride film is formed on the portion from the upper electrode 9 to the reinforcing member 10.

Figure 6:
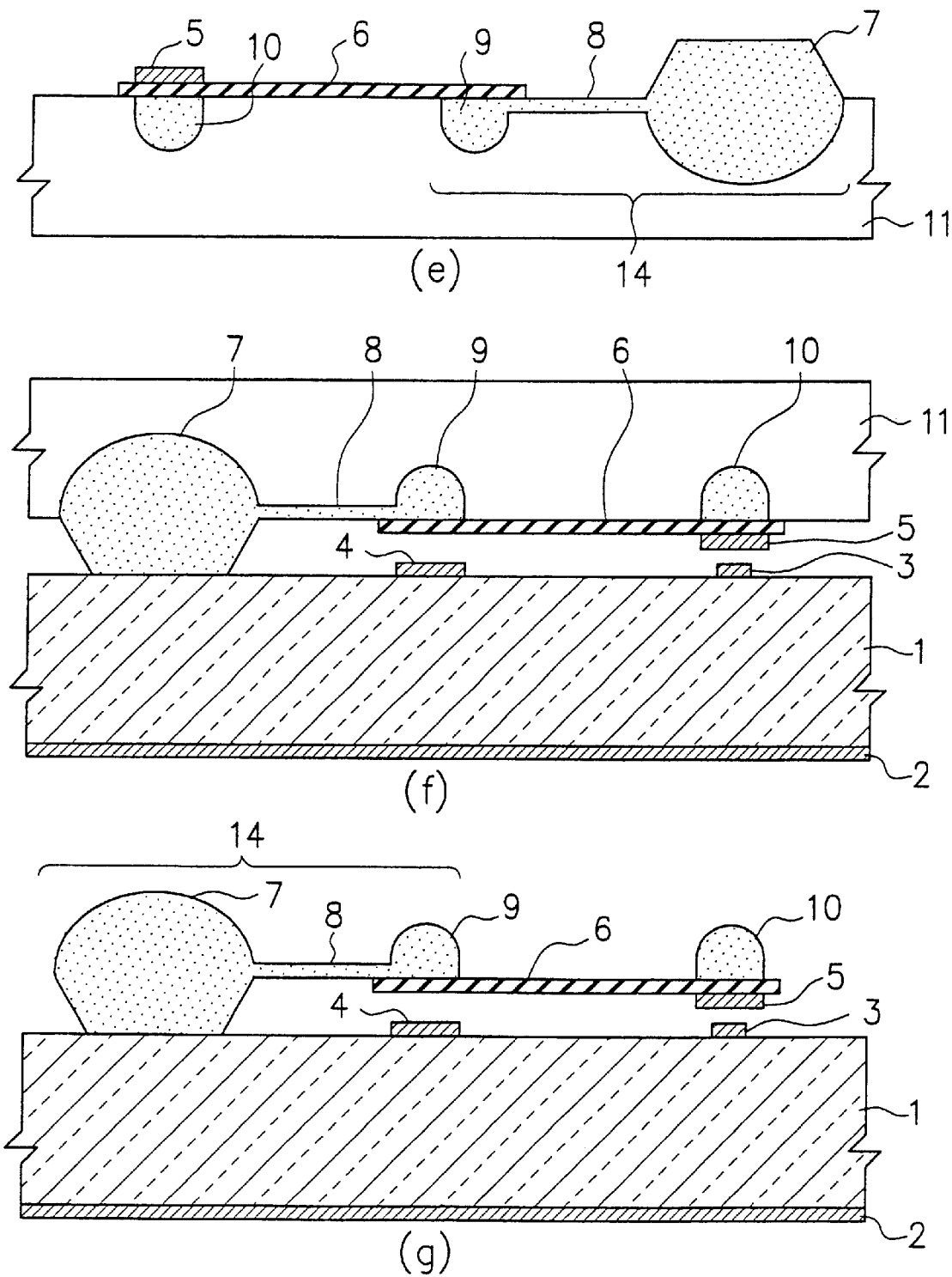
FIGS. 6(e), 6(f) and 6(g) are cross-sectional views illustrating the manufacturing process of the micro machine switch of FIGS. 4(a) and 4(b), which are the continuation of FIGS. 5.

Then, as shown in FIG. 6(*e*), a contact electrode 5 is formed on the insulating member 6 in such a position as to face the reinforcing member 10 by the use of gold plating.

And as shown in FIG. 6(*f*), the substrate 11 formed as above is placed on a glass substrate 1 with a lower electrode 4 comprising gold and signal lines 3 and 3a both comprising gold formed thereon. The substrate 1 is previously formed using the process different from that used in silicon substrate processing. Then the supporting member 7 is bonded to the substrate 1. For bonding silicon and glass to each other, an electrostatic bonding technique can be used.

Finally, as shown in FIG. 6(*g*), the substrate 11 is dipped into an etchant with high boron-concentration selectivity, such as ethylenediaminepyrocatechol, so as to dissolve the portion in which no boron is diffused. Thus, a micro machine switch can be formed on the substrate 1.

When the substrate 1 is formed of ceramic or gallium arsenide, the supporting member 7 and the substrate can be bonded to each other with a bond. Alternatively, an electrostatic bonding technique can also be used if the surface of the substrate is sputtered with glass to the thickness of about 2 to 5 μm.

As described above, the micro machine switch according to this embodiment, the switch body 14 including the cantilever arms 7 etc. is formed by etching a single crystal silicon substrate. And the micro machine switch according to this embodiment offers the advantage of being able to produce the most reliable construction in terms of mechanical properties, because it utilizes a single crystalline substance as a material.

Further, since the cantilever arms 8 are formed of a single crystalline substance alone, warps are never caused due to the difference in thermal expansion coefficient, unlike the cantilever arm structure according to the prior art in which a plurality of materials are bonded together. Specifically, the occurrence of warps are suppressed by allowing the changes in thermal expansion coefficient in the direction perpendicular to the surface of the substrate 1 to be symmetric with respect to the line passing through the cantilever arm lengthwise.

Alternatively, a switch having the same construction as the present invention can be formed by depositing any other type thin film on a substrate 1 and utilizing selective etch. For example, the switch body 14 and the reinforcing member 10 may be formed not of single crystal silicon, but of amorphous silicon, polycrystalline silicon or highly resistant semiconductor materials (GaAs, iron doped InP, etc.). Further, the switch body 14 and the reinforcing member 10 may be formed not of semiconductor, but of a metal such as gold or aluminium.

Third Embodiment

Referring to FIGS. 7(a) and 7(b), there are shown a plan view of the micro machine switch according to the third embodiment of the present invention and a cross-sectional view of the micro machine switch of FIG. 7(a), respectively. As shown in the same figures, the constituents denoted with the same reference numerals as in FIGS. 4(a) and 4(b) are identical or corresponding to those of FIGS. 4(a) and 4(b).

The micro machine switch according to this embodiment differs widely from that of the second embodiment in that an insulating member 6b extends from one end surface of the upper electrode 9. The insulating member 6b can be formed of an insulating thin film such as oxide or nitride, and at the same time, it can be formed of the same semiconductor material as that of the upper electrode 9. In the latter case, two methods can be used: one is such that the insulating member 6b, the supporting member 7, the cantilever arms 8 and the upper electrode 9 are all formed of a highly resistant semiconductor material (GaAs, iron doped InP, etc.) and the resistance of all the above constituents except the insulating member 6b is decreased by diffusing impurities therein; and the other is such that the resistance of the insulating member 6b is increased by implanting ions such as oxygen into the region thereof. In the micro machine switch according to this embodiment, a reinforcing member 10 is provided in the position opposite to the contact electrode 5; however, it is to be understood that the micro machine switch construction without a reinforcing member 10 is also within the scope of the present invention.

The reinforcing member may be low resistant or highly resistant.

In the micro machine switch according to this embodiment, an insulating member 6a is provided on the bottom surface of the upper electrode 9 independent of the insulating member 6b. The reason for providing the insulating member 6a is to prevent the upper electrode 9 and the lower electrode 4 from coming in contact with each other and thereby prevent short circuit from occurring when applying voltage between them. Preferably the insulating member 6a has thickness smaller than that of the contact electrode 5.

The insulating member 6a may be provided on the bottom surface of the upper electrode 9 as shown in FIG. 7(b), or it may be provided on the top surface of the lower electrode 4. Or it may be provided both on the bottom surface of the upper electrode 9 and on the top surface of the lower electrode 4.

In the micro machine switch according to this embodiment, the insulating member 6b is placed upper, relative to the substrate 1, than that of the micro machine switch according to the embodiment 1, therefore, the space between the contact electrode 5 and the signal lines 3 can be made larger. This allows the electrostatic capacity when the switch is in the off state to become small, and thereby the leakage current when the switch is in the off state can be kept small.

The embodiments so far have been described in terms of the cases where the concrete example of the substrate 1 is a glass substrate. The glass substrate is low-cost compared with a gallium arsenide substrate and is a promising material in the application to phased array antennas etc., which require the integration of a large number of switches. It is, however, to be understood that the substrate applied to the construction of the present invention is not limited to a glass substrate, but the present invention is still effective when applying thereto other substrates, for example, gallium arsenide, silicon, ceramic and printed board.

A technique of decreasing the squeeze effect, due to the air existing between the upper electrode 9 and the lower electrode 4, by making holes in the upper electrode 9 is also within the scope of the present invention. In the micro machine switch of the present invention, it is easy to reinforce the strength of the insulating member 6b with the upper electrode 9 and the reinforcing member 10. Therefore, even if a plurality of holes are provided in the inside of the switch, the rigidity of the entire moving portion can be kept satisfactorily large.

Further, if the air is allowed to easily pass through the insulating member 6b, the contact electrode 5 and the reinforcing member 10 by making holes therein, the squeeze effect can be considerably suppressed.

Fourth Embodiment

Figure 8:
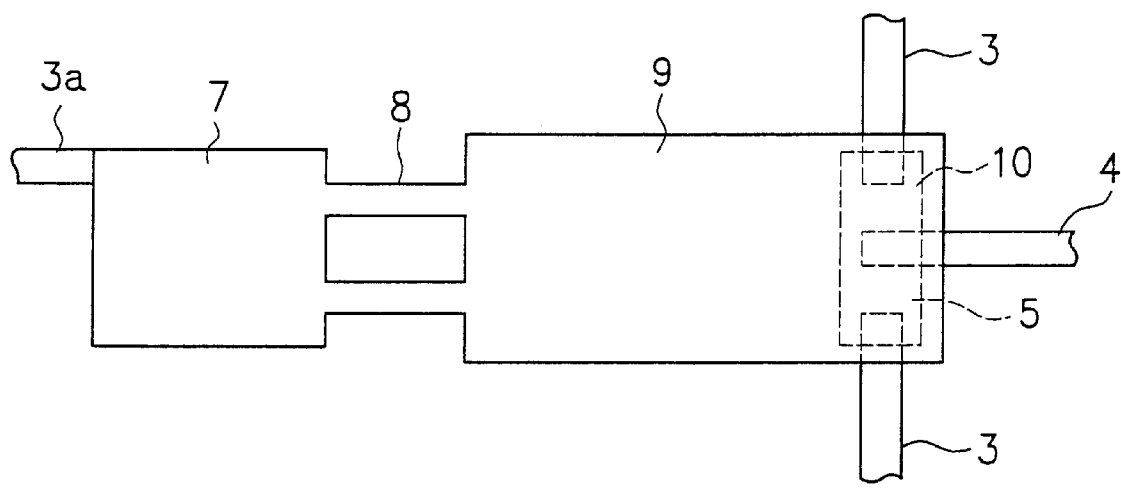
FIG. 8 is a plan view of the micro machine switch according to a fourth embodiment of the present invention.

Referring to FIG. 8, there is shown a plan view of the micro machine switch according to a fourth embodiment of the present invention. In the same figure, the constituents denoted with the same reference numerals as in FIGS. 1(a) and 1(b) are identical or corresponding to those of FIGS. 1(a) and 1(b). As shown in FIG. 8, in the micro machine switch according to this embodiment, a lower electrode 4 is provided in the gap between the signal lines 3. It goes without saying that the lower electrode 4 is provided in the lower position than the end portions of the signal lines 3; accordingly, the contact electrode 5 comes in contact with the end portions of the signal lines 3 when the cantilever arms 8 are bent downward, but it never come in contact with the lower electrode 4.

Providing the lower electrode 4 as close to the tip of the arms as possible allows operating of the arms with only slight electrostatic force, and hence decreasing the value of voltage applied to the lower electrode 4. Naturally, when treating high-frequency signals with such construction, signals flowing through the signal lines 3 are likely to leak in the lower electrode 4. Therefore, this construction should be used only for treating DC or low-frequency signals.

Fifth Embodiment

Figure 9:
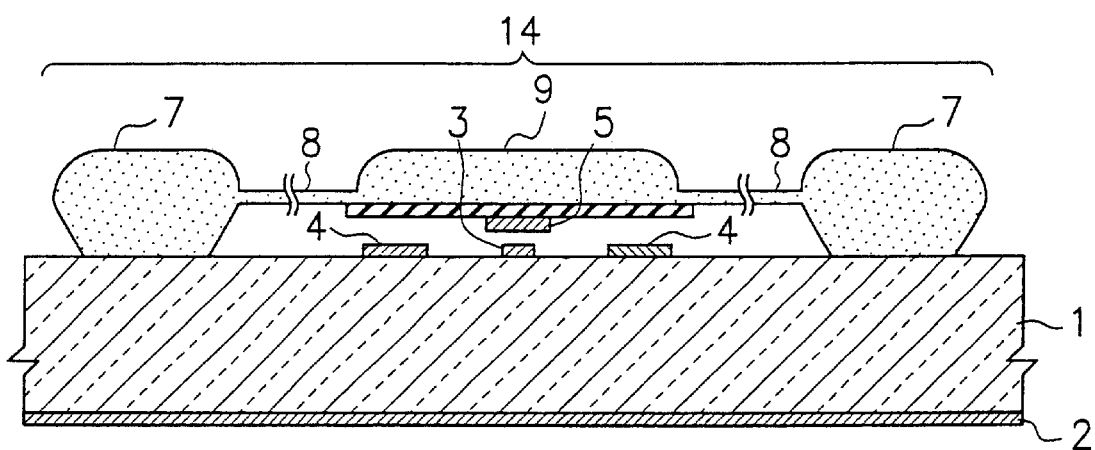
FIG. 9 is a cross-sectional view of the micro machine switch according to a fifth embodiment of the present invention.

Referring to FIG. 9, there is shown a cross-sectional view of the micro machine switch according to a fifth embodiment of the present invention. In the same figure, the constituents denoted with the same reference numerals as in FIGS. 1(a) and 1(b) are identical or corresponding to those of FIGS. 1(a) and 1(b). As shown in FIG. 9, in the micro machine switch according to this embodiment, two supporting members 7 are provided on the substrate 1 in such a manner as to face each other across the signal lines 3. Accordingly, the upper electrode 9 is connected to the cantilever arms 8 extending from the respective supporting members 7 and supported thereby from both sides. And in order to produce sufficient electrostatic force, two lower electrodes 4 are provided at different points under the upper electrode 9 in such a manner as to face each other across the signal lines 3.

The micro machine switch construction in which the upper electrode 9 is supported with more than one supporting member 7 is also within the scope of the present invention. The number of the supporting members may be increased to three or more, and the micro machine switch of such construction is also within the scope of the present invention.

Sixth Embodiment

Figure 10:
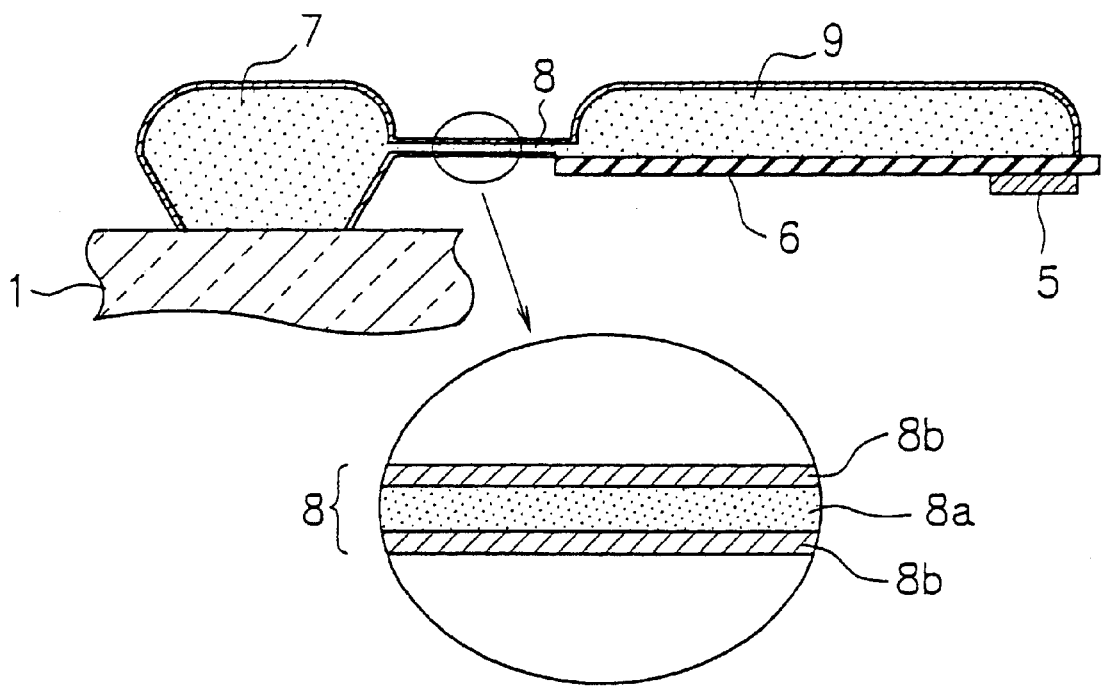
FIG. 10 is a cross-sectional view of the micro machine switch according to a sixth embodiment of the present invention.

Referring to FIG. 10, there is shown a cross-sectional view of the micro machine switch according to a sixth embodiment of the present invention. In the same figure, the constituents denoted with the same reference numerals as in FIGS. 1(a) and 1(b) are identical or corresponding to those of FIGS. 1(a) and 1(b). As shown in FIG. 10, in the micro machine switch according to this embodiment, the surface of the switch body 14 is, for example, oxidized and thereby the cantilever arms 8 are allowed to have a structure comprising a silicon layer 8a and silicon oxide layers 8b between which the silicon layer 8a is sandwiched. If the two silicon oxide layers 8b are allowed to have the same thickness, the thermal expansion coefficients on the substrate 1 side and on its opposite side becomes symmetric; therefore, warps caused in the cantilever arms 8 can be suppressed even when performing high-temperature treatment.

Seventh Embodiment

Figure 11:
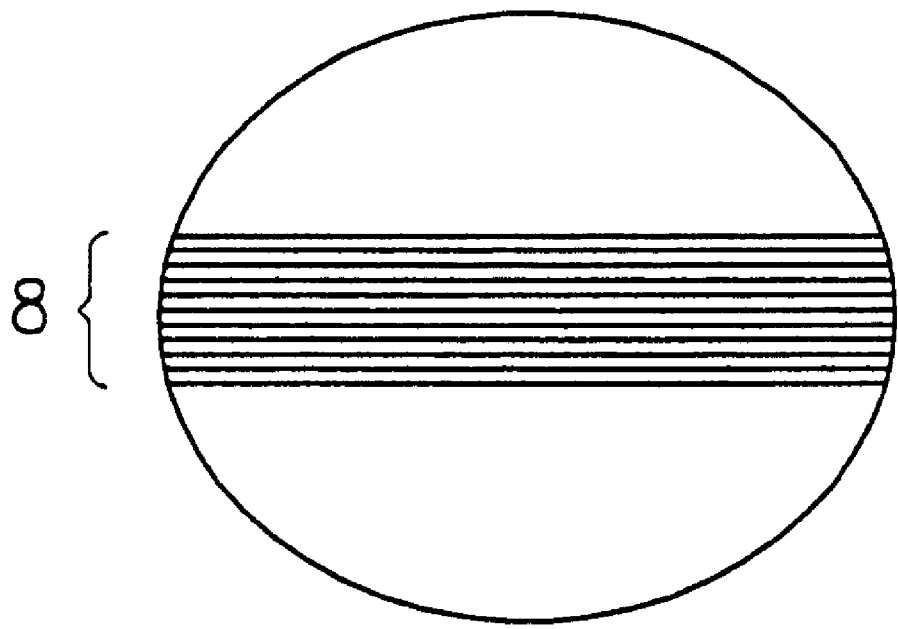
FIG. 11 is a cross-sectional view of the micro machine switch according to a seventh embodiment of the present invention.

Referring to FIG. 11, there is shown a cross-sectional view of the micro machine switch according to a seventh embodiment of the present invention. In the same figure, the constituents denoted with the same reference numerals as in FIG. 10 are identical or corresponding to those of FIG. 10. As shown in FIG. 11, in the micro machine switch according to this embodiment, the cantilever arms 8 have superlattice structure in which thin films of two or more materials are stacked alternately. Like the sixth embodiment, in the micro machine switch according to this embodiment, the thermal expansion coefficients on the substrate 1 side and on its opposite side are allowed to be symmetric; therefore, warps caused in the cantilever arms 8 due to temperature changes can be suppressed.

Eighth Embodiment

In the following, the case will be described where the micro machine switches according to the first to seventh embodiments are applied to phased array antenna systems.

As shown below, the micro machine switches described above can be applied to a wide range of signals, that is, DC to high-frequency signals, and they are effective particularly when applied to phased array antenna systems.

Figure 12:
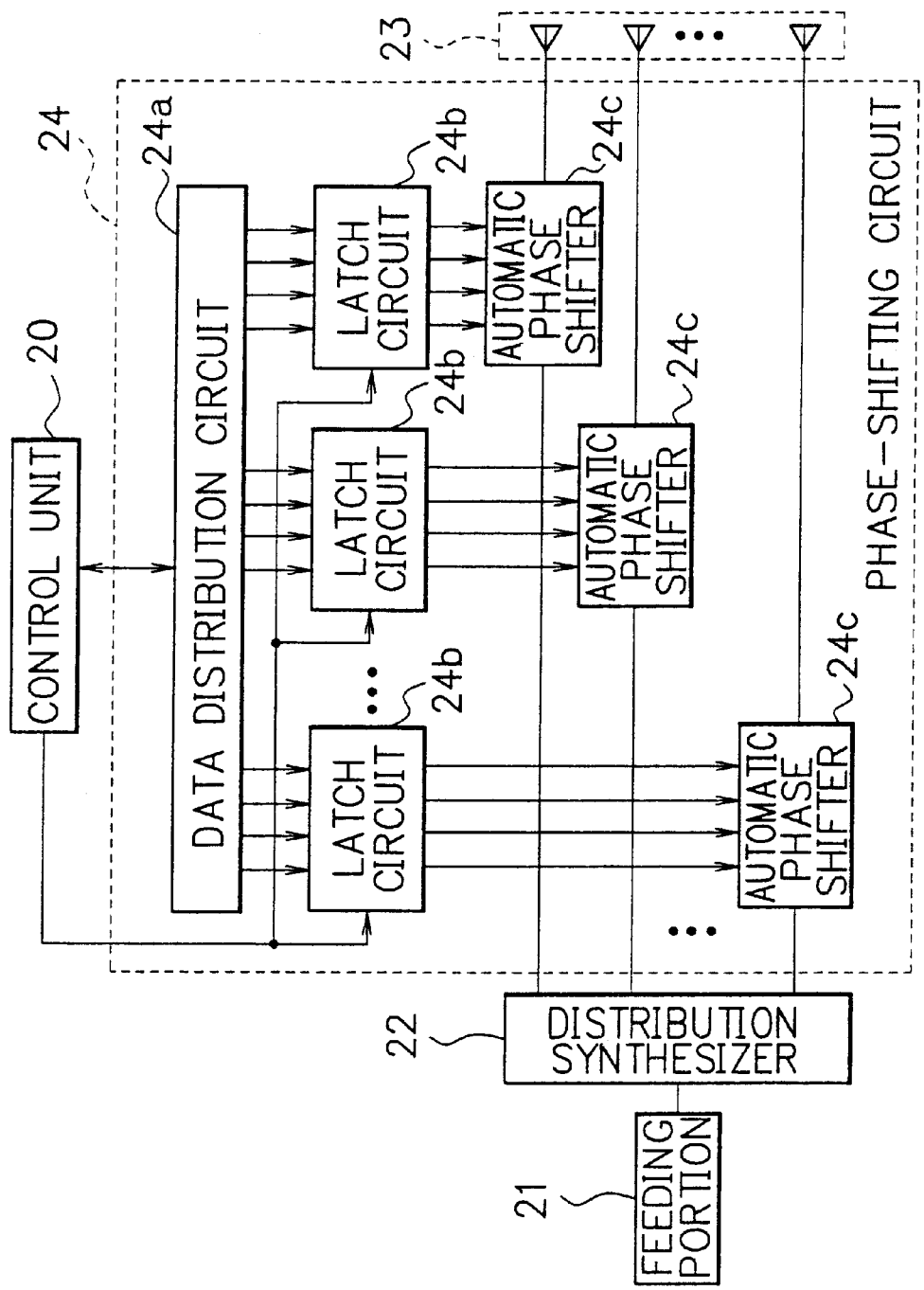
FIG. 12 is a block diagram of a phased array antenna system (an eighth embodiment of the present invention)

Referring to FIG. 12, there is shown a block diagram of a phased array antenna system disclosed in Japanese Patent Application No. H10-176367. As shown in the same figure, the phased array antenna system has M (M is a natural number of 2 or larger) antennas 23, which are connected to a phase-shift circuit 24. The phase-shift circuit 24 consists of a data distributing circuit 24a, M data latch circuits 24b connected to the data distributing circuit 24a and automatic phase shifters 24c connected to the data latch circuits 24b.

Accordingly, the antennas 23 are connected to respective N (N is a natural number) bit(s) automatic phase shifters 24c, which are connected to a feeding portion 21 via a distribution synthesizer 22.

The data distributing circuit 24a is also connected to a control unit 20. And the data distributing circuit 24a and the data latch circuits 24b are realized by a thin film transistor circuit (TFT circuit) on a substrate.

Each automatic phase shifter 24c includes the above micro machine switch for each bit, and each data latch circuit 24b is connected to the micro machine switches of each automatic phase shifter 24c. Thus, in the phased array antenna system shown in the figure, the driving circuit of each automatic phase shifter, which has been an exterior type IC, consists of a TFT circuit and is formed together with the automatic phase shifter 24c etc. as an integral layer.

Now the operation of the phased array antenna system will be described. The control unit 20 calculates the phase shifting quantity optimal for directing radial beams toward a desired direction with N-bit accuracy, based on the position of the antennas 23 previously set and the frequency used, and outputs the results as control signals to the data distributing circuit 24a. The data distributing circuit 24a distributes the control signals to the data latch circuits 24b.

The direction of radio wave radiation at all the antennas 23 is switched simultaneously. At that time, each data latch circuit 24b rewrites the hold data to control signals, as input data, in synchronization with the timing signals for switching the direction of the beam and, based on the hold data (control signals), applies driving voltage simultaneously to the micro machine switches of the bits the automatic phase shifters 24c require.

The micro machine switches close the data latch circuits when applying driving voltage thereto and allow the bits in which they are contained to be in the on state. The phase shifting quantity of each automatic phase shifter 24c is set depending on which bits are allowed to be in the on state.

Each automatic phase shifter 24c changes the phase of high-frequency signals by the phase shifting quantity set as above and feeds power to each antenna 23. And each antenna 23 radiates high-frequency signals of the phase corresponding to the feeding phase and forms a radial beam in the direction perpendicular to the equiphase wave surface by the radiation generating an equiphase wave surface.

Then the structure of the phased array antenna system of FIG. 12 will be described in detail.

Referring to FIG. 13, there is shown an exploded perspective view illustrating phased array antenna system of FIG. 12. As shown in the figure, the entire phased array antenna system has a multilayer structure. Specifically, a distribution synthesizing layer L1, a dielectric layer L2, a power supply slot layer L3, a dielectric layer L4, a layer L5 comprising radiating elements, automatic phase shifters and TFT circuits (hereinafter referred to as phase-shift circuit layer), a dielectric layer L6 and a parasitic element layer L7 are closely bonded together.

The phased array antenna system is multi-layered utilizing the photolithography, the etching technique, the bonding technique, etc. For example, the parasitic element layer L7 and the phase-shift circuit layer L5 are formed by applying the photolithography and the etching technique to the metal layers formed on both sides of the dielectric layer L6. The power supply slot layer L3 is formed by applying the photolithography and the etching technique to the metal layer formed on one side of the dielectric layer L4.

On the parasitic element layer L7, a plurality of parasitic elements 32 are formed. The parasitic elements 32 are used for widening the antenna band and electromagnetically coupled with radiating elements of the phase-shift circuit layer L5 via the dielectric layer L6. For the dielectric layer L6 dielectric with specific inductive capacity of about 2 to 10 is used. The use of glass, for example, allows the reduction of manufacturing costs, therefore, preferably glass is used for at least one of the dielectric layers. Taking no account of the problem of manufacturing costs, dielectric, such as alumina with high specific inductive capacity and foam with low specific inductive capacity, may be used for the dielectric layer L7.

On the phase-shift circuit layer L5, part of the antennas 23 shown in FIG. 12, a phase-shift circuit 24, strip lines for feeding power to the antennas 23, etc. are formed.

The dielectric layer L4 is formed of dielectric with specific inductive capacity of about 3 to 12, such as alumina.

The power supply slot layer L3 is formed of a conductive metal and has a plurality of power supply slots 30, as power supply coupling means, formed thereon. The power supply slot layer 30 is connected to the phase-shift circuit layer L5 via through holes properly provided in the dielectric layer L4 and functions as an earth of the phase-shift circuit layer L5.

On the distribution synthesizing layer L1, a plurality of distribution synthesizers 22 are formed. The distribution synthesizers 22 are electromagnetically coupled with the phase-shift circuit layer L5 via the power supply slots 30 provided in the power supply slot layer L3. A single distribution synthesizer 22 and a single power supply slot 30 constitute a single power feeding unit and a plurality of units are arranged in a matrix. However, it is to be understood that the phased array antenna in which the units are not arranged in a matrix is also within the scope of the present invention.

The radiating elements 32 may be arranged in a matrix or simply two-dimensionally. Or they may be arranged in a line. Although the distribution synthesizers 22 and the phase-shift circuit layer L5 are electromagnetically coupled with each other through the power supply slot layer L3 in FIG. 13, when they are connected to each other by the other power supply coupling means, such as feeding pins, they may be formed on the same plane.

In the following the phase-shift circuit layer L5 shown in FIG. 13 will be described in detail.

Figure 14:
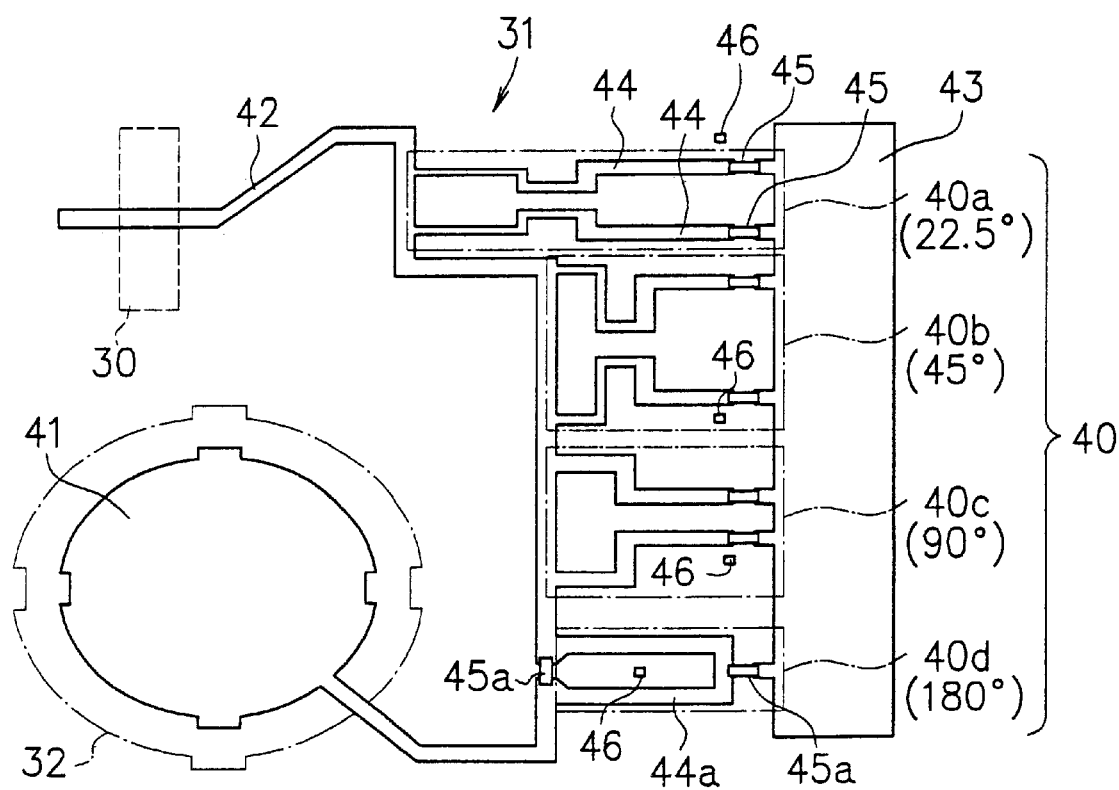
FIG. 14 is a plan view of the phase-shift circuit of FIG. 13.

Referring to FIG. 14, there is shown a plan view of a single unit of the phase-shift circuit L5. As shown in the same figure, on the dielectric layer L6 of, for example, a glass substrate, a radiating element 41, a group of automatic phase shifters 40 and data latch circuits 46 are formed. Each data latch circuit 46 is provided for each bit of the automatic phase shifters 40a to 40d.

The strip line 42 is provided from the radiating element 41 to such a position so as to corresponding to the power supply slot 30 shown in FIG. 13 through the group of automatic phase shifters 40. As the radiating element 41, for example, a patch antenna, a printed dipole, a slot antenna or an aperture element is used. And as the strip line 42, a distributed constant line such as micro strip line, triplate line, coplanar line or slot line is used.

The group of automatic phase shifters 40 shown in FIG. 14, as a whole, constitutes a 4 bits automatic phase shifter, that is, consists of 4 automatic phase shifters 40a, 40b, 40c and 40d. The automatic phase shifters 40a to 40d can change feeding phase by 22.5°, 45°, 90° and 180°, respectively, and each of them consists of strip lines and a micro machine switch.

Each of the automatic phase shifters 40a to 40c consists of two strip lines 44 connected between the strip line 42 and an earth 43 and micro machine switches 45 connected in the middle of the strip lines 44. Each of these automatic phase shifters constitutes a loaded line type automatic phase shifter.

On the other hand, the automatic phase shifter 40d consists of a micro machine switch 45a connected in the middle of the strip line 42, a strip line 44a in the form of a rectangle with its one side opened and a micro machine switch 45a connected between the strip line 44a and the earth 43. This automatic phase shifter constitutes a switched line type automatic phase shifter.

Generally, when the phase shifting quantity is small, good characteristics can be obtained by the use of the loaded line type automatic phase shifter. And when the phase shifting quantity is large, good characteristics can be obtained by the use of the switched line type one. For this reason, the loaded line type automatic phase shifter is used for the phase shifting of 22.5°, 45° and 90° and the switched line type automatic phase shifter is used for the phase shifting of 180°. It goes without saying that the switched line type one can also be applied to the automatic phase shifters 40a to 40c.

The two micro machine switch (45 or 45a) contained in each of the automatic phase shifters 40a to 40d are connected to the data latch circuit 46 provided in the neighborhood thereof and allowed to operate simultaneously by the driving voltage output from the data latch circuit 46. Thus, the feeding phase of the high-frequency signals flowing through the strip line 42 is changed by means of the group of automatic phase shifters 40.

The data latch circuits 46 are not necessarily arranged in the neighborhood of the respective micro machine switches, but a plurality of data latch circuits may be arranged in one place from which wiring is extended to each micro machine switch so as to drive it. Alternatively, a single data latch circuit may be connected to a plurality of different units of micro machine switch.

Figure 15:
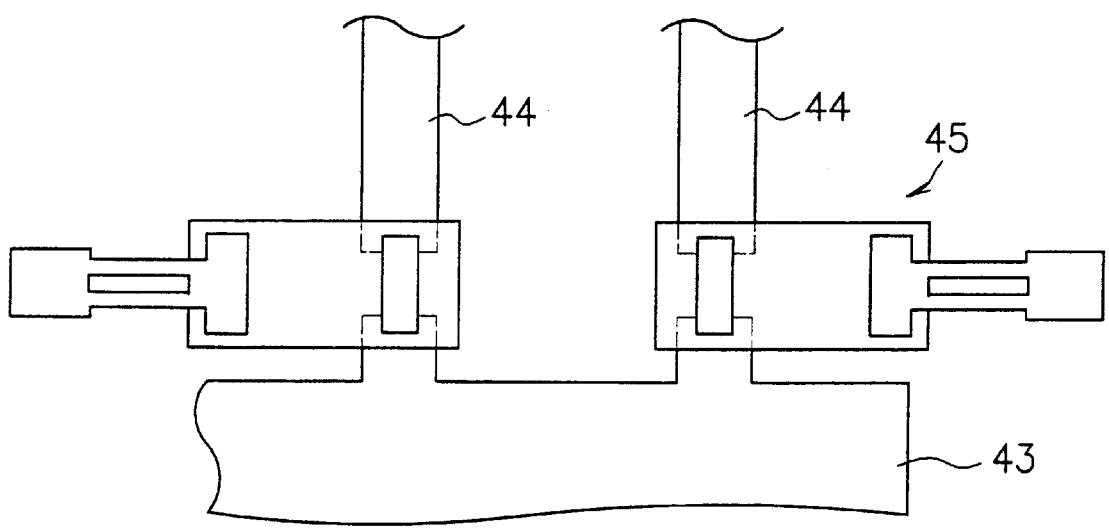
FIG. 15 is a plan view of the micro machine switch of FIG. 14 and vicinity.

Referring to FIG. 15, there is shown an enlarged plan view of the micro machine switch 45 and its vicinity used in the loaded line type automatic phase shifter. As shown in the figure, the two micro machine switches 45 are arranged in such a manner as to be symmetric with respect to the two strip lines 44. And these micro machine switches 45 are connected to a single data latch circuit not shown in the figure and provided with driving voltage (external voltage) simultaneously therefrom. It goes without saying that the micro machine switches 45 described in terms of the first to seventh embodiments can also be used in this type automatic phase shifter.

INDUSTRIAL APPLICABILITY

As described so far, according to the micro machine switch of the present invention, the changes in thermal expansion coefficient on the substrate side of the beam member with small mechanical rigidity and on the opposite side of the same are allowed to be symmetric. Accordingly, warps caused due to the distortion occurring between different materials, as seen in the micro machine switch of the prior art, are considerably relieved. When making measurements for the experimentally manufactured switches, it was found that the variation in contact resistance created due to single contact etc. was narrowed and thereby a large amount of switches uniform in characteristics could be manufactured.

It was also found that the change in switching operation was considerably small even if the ambient temperature of the switch changed.

And according to the micro machine switch of the present invention, the supporting member, the beam member and the upper electrode are all formed of the same material, and thereby the manufacturing process can be simplified.

Further, since the high-temperature process can be utilized, the number of alternatives for the materials constituting the beam member etc. is increased and various types conductors and semiconductors can be utilized, thus the degree of freedom of selecting material is increased. The insulating film formed at high temperatures in particular is excellent in resistance to pressure, which may contribute to electrical characteristics of devices.

Further, since the degree of freedom of the beam member (cantilever arm) is increased in the thickness direction, the width of the arm can be decreased, and thereby the size of the switch can also be decreased.

Because of the excellent effects as described above, the micro machine switch according to the present invention can be applied not only to a simple switch which uses only a single micro machine switch, but also to a phased array antenna system which requires micro machine switches on the order of thousands to be integrated on a large area of substrate.

What is claimed is:

1. A micro machine switch for controlling conduction/non-conduction between first and second signal lines which are provided on a substrate in such a manner as to leave a predetermined gap between end portions thereof, comprising:
- a supporting member provided on said substrate in such a manner as to be adjacent to said gap and to have a predetermined height with respect to a surface of said substrate;
- a flexible beam member provided in such a manner as to project from the supporting member and to extend so far that part of the beam member faces said gap;
- a contact electrode provided at least on a substrate side of the beam member in such a position so as to face said gap; and
- a lower electrode provided on said substrate in such a manner as to face part of said beam member,
- wherein said beam member has a part ranging from a portion that is connected to said supporting member to a portion facing said lower electrode, is conductive, having a function as an upper electrode, and
- thermal expansion coefficients of said beam member are almost symmetric in a thickness direction perpendicular to said surface of the substrate, at least in a region ranging from the portion at which the beam member is connected to said supporting member to a vicinity of the portion facing said lower electrode.

2. The micro machine switch according to claim 1, characterized in that said substrate is a glass substrate or a ceramic substrate.

3. The micro machine switch according to claim 1, characterized in that said substrate is a gallium arsenide substrate.

4. A micro machine switch for controlling conduction/non-conduction between first and second signal lines which are provided on a substrate in such a manner as to leave a predetermined gap between end portions thereof, comprising:
- a supporting member provided on said substrate in such a manner as to be adjacent to said gap and to have a predetermined height with respect to a surface of said substrate;
- a flexible beam member provided in such a manner as to project from the supporting member and to extend so far that part of said beam member faces said gap;
- a contact electrode provided at least on a substrate side of the beam member in such a position so as to face said gap; and
- a lower electrode provided on said substrate in such a manner as to face part of said beam member,
- wherein an angle made between a surface of the substrate side of said beam member and a surface of said supporting member connected to said beam member is an obtuse angle.

5. A micro machine switch for controlling conduction/non-conduction between first and second signal lines which are provided on a substrate in such a manner as to leave a predetermined gap between end portions thereof, comprising:
- a supporting member provided at least on said substrate in such a manner as to be adjacent to said gap and to have a predetermined height with respect to a surface of said substrate;
- a flexible beam member provided in such a manner as to project from the supporting member and to extend so far that part of said beam member faces said gap;
- a contact electrode provided at least on a substrate side of the beam member in such a position so as to face said gap; and
- a lower electrode provided on said substrate in such a manner as to face part of said beam member,
- wherein said supporting member protrudes higher than a surface of said beam member opposite to a surface of the substrate side of the beam member at a portion where the supporting member is connected to said beam member.

6. The micro machine switch according to claim 5, wherein an angle made between the surface of said beam member opposite to the surface of the substrate side of the beam member and a surface of said supporting member protruding higher than said surface of the beam member is an obtuse angle.

7. The micro machine switch according to claim 6, wherein an angle made between the surface of the substrate side of said beam member and a surface of said supporting member to which the beam member is connected is an obtuse angle.

8. The micro machine switch according to claim 1, characterized in that said contact electrode is provided on said substrate side of said beam member via an insulating member.

9. The micro machine switch according to claim 1, wherein on a surface of said beam member opposite to a surface provided with said contact electrode, a reinforcing member is provided in such a manner as to face said contact electrode.

10. The micro machine switch according to claim 1, characterized in that said contact electrode is coated with an insulating material film capable of capacity connecting to said first and second signal lines.

11. The micro machine switch according to claim 1, characterized in that said lower electrode is provided on said substrate in such a position so as to be between said supporting member and said gap.

12. The micro machine switch according to claim 1, characterized in that said supporting member and at least part of said beam member are formed of the same conductive material as an integral unit.

13. The micro machine switch according to claim 1, wherein part of said beam member, ranging from the portion at which it is connected to said supporting member at least to the portion facing said lower electrode, is formed of a conductive member and on a tip portion of the conductive member an insulating member is provided which extends to the position facing said gap, said contact electrode being provided on the insulating member in such a manner as to face said gap.

14. The micro machine switch according to claim 12, characterized in that said conductive member is made of a semiconductor material.

15. The micro machine switch according to claim 1, characterized in that said beam member is made of a semiconductor material and at least the region of the beam member ranging from the portion at which said contact electrode is provided to the portion facing said lower electrode is insulated.

16. The micro machine switch according to claim 14, characterized in that said semiconductor material is a single crystal semiconductor.

17. The micro machine switch according to claim 14, characterized in that said semiconductor material is an amorphous semiconductor or polycrystalline semiconductor.

18. The micro machine switch according to claim 1, characterized in that said micro machine switch is used in a phased array antenna system.

* * * * *